United States Patent
Asai et al.

[19]

[11] Patent Number: 5,949,681
[45] Date of Patent: Sep. 7, 1999

[54] ELECTRONIC-COMPONENT SUPPLYING APPARATUS

[75] Inventors: Koichi Asai, Nagoya; Yasuo Muto, Chiryu, both of Japan

[73] Assignee: Fuji Machine Mfg. Co., Ltd., Chiryu, Japan

[21] Appl. No.: 08/813,287

[22] Filed: Mar. 10, 1997

[30] Foreign Application Priority Data

Mar. 15, 1996 [JP] Japan ................................. 8-058829

[51] Int. Cl.⁶ ........................... B07C 17/00; G08C 19/00; B23D 19/00
[52] U.S. Cl. .................. 364/468.2; 364/478.01; 364/478.16; 340/825.69; 340/825.72; 29/759; 29/760
[58] Field of Search ................... 364/478.01, 468.23, 364/468.22, 478.08, 468.28, 468.2, 478.16; 340/825.69, 825.72; 29/759, 760

[56] References Cited

U.S. PATENT DOCUMENTS

| | | | |
|---|---|---|---|
| 4,747,198 | 5/1988 | Asai et al. | 29/407 |
| 5,189,624 | 2/1993 | Barlow et al. | 364/474.11 |
| 5,339,248 | 8/1994 | Fujiwara et al. | 364/468 |
| 5,556,247 | 9/1996 | Lichti, Sr. et al. | 414/331 |
| 5,588,195 | 12/1996 | Asai et al. . | |
| 5,743,005 | 4/1998 | Nakao et al. | 524/459 |

FOREIGN PATENT DOCUMENTS

| | | |
|---|---|---|
| B2-58-23723 | 5/1983 | Japan . |
| A-63-98185 | 4/1988 | Japan . |
| A-5-275885 | 12/1993 | Japan . |
| A-6-204043 | 7/1994 | Japan . |
| U-6-53041 | 7/1994 | Japan . |

*Primary Examiner*—William Grant
*Assistant Examiner*—Iván Calcaño
*Attorney, Agent, or Firm*—Oliff & Berridge, PLC

[57] ABSTRACT

An electronic component supplying apparatus including a frame member, component supplying units each including a movable member movable along a reference line, first drive sections each provided on a corresponding one of the movable members of the units, a second drive section provided on the frame member, first control devices each provided on the corresponding one movable member, a power source, a second control device provided stationarily relative to the frame member, a supplying device which includes a first supplying section provided on the frame member and second supplying sections each provided on the corresponding one movable member, has no wire connection between the first supplying section and the each second supplying section, and supplies the electric energy from the power source to the each first control device, while permitting the one movable member to be moved along the reference line, and a transmitting device which includes a first transmitting section provided on the frame member and second transmitting sections each provided on the corresponding one movable member, has no wire connection between the first transmitting section and the each second transmitting section, and transmits, from the second control device to the each first control device, information needed to control the each first drive section, while permitting the one movable member to be moved along the reference line.

13 Claims, 8 Drawing Sheets

ELECTRONIC-COMPONENT SUPPLYING APPARATUS

BACKGROUND OF THE INVENTION

1. Field of the Invention

The present invention relates to an electronic component supplying apparatus which employs a plurality of units for supplying electronic components.

2. Related Art Statement

There is known an electronic component ("EC") supplying apparatus including a plurality of EC supplying cartridges each of which is selectively moved to an EC supplying position for supplying ECs. Each of the cartridges carries a number of ECs, and has an EC supplying portion from which the ECs are supplied. The cartridges are supported on a movable member such that respective EC supplying portions of the cartridges are arranged along a reference line, and cooperates with the movable member to provide a component supplying unit. The unit is moved along the reference line so that an appropriate one or ones of the cartridges is or are moved to the EC supplying position for supplying ECs.

Various sorts of EC supplying cartridges are known. A sort of EC supplying cartridge which is employed in the embodiments described later includes a tape feeding device which feeds an EC carrier tape carrying a number of ECs, for supplying the ECs. Another sort of EC supplying cartridge includes a casing which holds a number of ECs arranged in an array and a vibrating device which vibrates the casing to feed the ECs.

Two or more cartridges of a component supplying unit may carry different sorts of ECs, respectively. Otherwise, two or more cartridges out of three or more cartridges of a unit may carry the same sort of ECs and another cartridge may carry another sort of ECs. In the former case, the unit may supply many sorts of ECs. In the latter case, the unit may supply an increased number of ECs from the two or more cartridges, so that the supplying of ECs from all the cartridges may terminate at substantially the same time. In the latter case, if all the ECs are supplied from one of the two or more cartridges, an operator may replace the said one cartridge with a new one while another or the other of the two or more cartridges supplies the ECs in place of the said one cartridge.

The total number of ECs to be supplied to one object, such as a printed circuit ("PC") board, and/or the total number of sorts of the ECs are/is small in some cases and great in other cases. Since a movable member of a component supplying unit is adapted to the greatest number of ECs and/or the greatest number of sorts, the movable member cannot help having a large size. Accordingly, such a movable-member moving device is needed which can produce a great driving force to move the movable member. In addition, since the large-size movable member has a great inertia, the the movable member cannot be moved at high speeds, which adversely reduces the work efficiency of the EC supplying unit. Moreover, the large-size movable member suffers from the problem that it produces a large vibration when being started and stopped. This problem leads to another problem that an EC picking-up apparatus, such as an EC mounting apparatus, which picks up ECs from each EC supplying cartridge, may fail to pick and hold an EC supplied by the cartridge. Furthermore, in the case where only a single component supplying unit is employed in an EC supplying apparatus, the single unit must be stopped, when all the ECs are supplied from all the cartridges provided thereon, so that the single unit may be replaced by another or new ECs may be fed to the single unit. Thus, the work efficiency of the EC picking-up apparatus is reduced.

The above problems can be solved by employing two component supplying units in an EC supplying apparatus, as disclosed in Japanese Patent Application laid open for inspection under Publication No. 5(1993)-275885. In the case where the total number of ECs to be supplied and/or the total number of sorts of the ECs are/is not so great, all the necessary cartridges may be set on the movable member of one of the units. On the other hand, in the case where the total number of ECs and/or the total number of sorts of the ECs are/is great, all the necessary cartridges may be set separately on the respective movable members of the units. In the former case, only the said one unit is moved for supplying ECs and, in the latter case, the two units are moved individually one by one, or concurrently with each other, for supplying ECs.

The above-indicated document discloses a movable member moving device which moves a movable member of a component supplying unit. The moving device includes a ball screw which is supported by a main frame member of the EC supplying apparatus such that the ball screw is rotatable about an axis line thereof and is not movable in an axial direction thereof. The moving device additionally includes an electric motor which rotates the ball screw, and a nut which is fixed to the movable member and is threadedly engaged with the ball screw. The respective ball screws of the moving devices extend parallel to each other, and are rotated individually one by one, or concurrently with each other, so that the two units are moved individually one by one, or concurrently with each other, for supplying ECs.

However, in some cases, it is not possible to secure a sufficient space in which two ball screws are disposed to extend parallel to each other. In addition, since recently the total number of the ECs, and/or the total number of the sorts of the ECs, to be mounted on a PC board tends toward increasing, there are other cases in which two component supplying units are insufficient and three or more units are necessary. In the latter cases, it is more difficult to secure a sufficient space in which three or more ball screws are disposed to extend parallel to each other. Moreover, in the case where three or more component supplying units are employed, it is almost impossible to employ a movable-member moving device having a conventional construction including ball screws and nuts. Each unit having a nut threadedly engaged with a corresponding ball screw is moved to an EC supplying area in which each unit supplies ECs, and a waiting area which is different from the EC supplying area and in which each unit does not interfere with the EC supplying operation of another unit or the other units. The EC supplying area is common to the three or more units. Accordingly, in the EC supplying area, the three or more ball screws are disposed to extend parallel to one another such that each movable member is moved to the EC supplying area over all the ball screws. To this end, it is required that the width of each movable member, i.e., dimension thereof in a direction perpendicular to the direction of movement thereof be greater than the distance between the two ball screws corresponding to the opposite ends of all the ball screws, respectively. However, each movable member cannot have such a great width and accordingly it is very difficult to employ three or more component supplying units.

By the way, a single ball screw may be used with a plurality of component supplying units in such a way that the ball screw is fixed to a frame member of an EC supplying apparatus, such that the screw is not movable or rotatable relative to the frame member, and a nut threadedly engaged with the screw is attached to each of respective movable members of the units such that the nut is rotatable by an electric motor provided on each movable member. In this case, the single ball screw supports the movable members, irrespective of whether the widths thereof are small or great, such that the movable members are moved one by one or two or more of the movable members are moved concurrently.

In the above case, however, an electricity supplying line connects between an electric-power source which is provided stationarily with respect to the frame member of the EC supplying apparatus, and a motor control device which is provided on each movable member and controls the electric motor thereof, and a signal transmitting line transmits a movable-member control signal to the motor control device. Accordingly, the respective end portions of the electricity supplying line and the signal transmitting line are moved with the movable members but the opposite ends of the two lines are not moved. Therefore, there arise various problems, for example, that the highest speed of each movable member is limited because of an increased mass thereof, that flexible wiring/piping protectors (hereinafter, referred to as the "protectors") which protect the electricity supplying and signal transmitting lines may be damaged, that those lines may break, that noise is produced when the protectors are moved, that the protectors need to have a construction ensuring that they are movable with the movable members, and that the size of the EC supplying apparatus as a whole is increased, or the total number of component supplying units that can be employed is limited, because the protectors occupy a wide space.

SUMMARY OF THE INVENTION

It is therefore an object of the present invention to provide an electronic component supplying apparatus which includes a plurality of electronic component supplying units and which is free from at least one of the above-identified problems.

According to the present invention, there is provided an electronic component supplying apparatus, comprising a frame member, a plurality of electronic component supplying units which are supported by the frame member, each of the units comprising a plurality of electronic component supplying cartridges each of which carries a plurality of electronic components and includes a component supplying portion from which the each cartridge supplies each of the components, and a movable member on which the cartridges are set such that the respective component supplying portions of the cartridges are arranged along a reference line, the movable member being movable along the reference line, a plurality of movable-member-side drive sections each of which is provided on a corresponding one of the respective movable members of the units, a frame-member-side drive section which is provided on the frame member and which is elongate along the reference line and cooperates with the each movable-member-side drive section to move the corresponding one movable member, a plurality of movable-member-side control devices each of which is provided on the corresponding one movable member and which controls the each movable-member-side drive section, a power source which is provided stationarily with respect to the frame member and which provides an electric energy, a frame-member-side control device which is provided stationarily with respect to the frame member, an electricity supplying device which includes a first supplying section provided on the frame member and a plurality of second supplying sections each of which is provided on the corresponding one movable member, the electricity supplying device having no wire connection between the first supplying section and the each second supplying section, and supplying the electric energy from the power source to the each movable-member-side control device, while permitting the corresponding one movable member to be moved along the reference line, and an information transmitting device which includes a first transmitting section provided on the frame member and a plurality of second transmitting sections each of which is provided on the corresponding one movable member, the information transmitting device having no wire connection between the first transmitting section and the each second transmitting section, and transmitting, from the frame-side control device to the each movable-member-side control device, information needed to control the each movable-member-side drive section, while permitting the corresponding one movable member to be moved along the reference line.

In the electronic component ("EC") supplying apparatus constructed as described above, the "common" no-wire-connection electricity supplying device supplies an electric energy to each of the respective movable-member-side control devices of the plurality of movable members. Each movable-member-side control device corresponding to a movable-member-side drive section controls the electric energy supplied from the electricity supplying device, based on the information transmitted by the "common" no-wire-connection information transmitting device, and drives that movable-member-side drive section. Thus, the movable members are moved one by one, or two or more of the movable members are moved concurrently with each other, so that an appropriate one of the EC supplying cartridges on each movable member is selected for supplying ECs. Each movable-member-side control device is supplied with the electric energy from the no-wire-connection electricity supplying device and with the control information from the no-wire-connection information transmitting device. Thus, the present EC supplying apparatus does not employ any electricity supplying lines, any signal transmitting lines, or any protectors which direct connect between each movable-member-side control device and the power source and frame-member-side control device both of which are provided on the side of the frame member, whose one ends are moved with the movable members, and whose opposite ends are not moved. Accordingly, the present apparatus is free from the problems that the lines and the protectors may be damaged or broken or noise is produced, and enjoys the advantages that each EC supplying unit can be moved at a high speed, that the apparatus can be constructed in a small size, and that a desired (two or greater) number of EC supplying units can easily be employed. Since the no-wire-connection electricity supplying device is constructed such that the single first supplying section is commonly used with the plurality of second supplying sections, the present apparatus enjoys a low production cost. In addition, since the no-wire-connection information transmitting device is constructed such that the single first transmitting section is commonly used with the plurality of second transmitting sections, the present apparatus enjoys a lower production cost. It is possible to employ a plurality of no-wire-connection electricity supplying devices for a plurality of EC supplying units, respectively, and supply an electric energy to each of the EC supplying units via a corresponding one of the electricity supplying devices. In this case, the electric energy which is supplied to each no-wire-connection electricity supplying device via an electricity supplying line must be controlled on the side of the frame member. Thus, the same number of no-wire-connection electricity supplying devices, and the same number of electricity supplying lines, as that of the EC supplying units are needed to control the respective movable-member-side drive sections of the EC supplying units. This arrangement leads to complicating the construction of the present apparatus and thereby increasing the production cost of the same. It is also possible to supply an electric energy to each of the EC supplying units via a single no-wire-connection electricity supplying device and supply a control information to each of the movable-member-side drive sections via a corresponding, exclusive one of a plurality of signal transmitting lines and a corresponding, exclusive one of a plurality of no-wire-connection information transmitting devices. In this case, the respective total numbers of no-wire-connection electricity supplying devices and electricity supplying lines are reduced, but the same number of no-wire-connection information transmitting devices, and the same number of signal transmitting lines, as that of the EC supplying units are needed to control the respective movable-member-side drive sections. In contrast, the present EC supplying apparatus needs the least numbers of no-wire-connection electricity supplying device and no-wire-connection information transmitting device, thereby contributing to reducing the production cost thereof. Since, as indicated above, it is very difficult to employ three or more movable members and provide an exclusive frame-member-side drive section for exclusively driving each of the movable members, the present invention is very advantageously applied to an EC supplying apparatus including three or more movable members. However, the present invention is applicable to an EC supplying apparatus including two movable members. As will be detailed in the description of the preferred embodiments, the present EC supplying apparatus may be adapted such that signals can be transmitted not only from the frame-member-side control device to each of the movable-member-side control devices but also from each movable-member-side control device to the frame-member-side control device. The present apparatus may be adapted such that signals can be transmitted only from the frame-member-side control device to each of the movable-member-side control devices.

According to a preferred feature of the present invention, the each movable-member-side drive section comprises a rotary engaging member which is attached to the corresponding one movable member such that the engaging member is rotatable about an axis line thereof, and an electric actuator which is provided on the corresponding one movable member and which rotates the rotary engaging member under control of the each movable-member-side control device, and the frame-member-side drive section comprises an elongate engaging member which is elongate along the reference line and is in engagement with the rotary engaging member of the each movable-member-side drive section. The rotary engaging member may be provided by, e.g., a nut, a pinion, etc.; the elongate engaging member may be provided by, e.g., a screw member, a rack, etc.; and the electric actuator may be provided by, e.g., a servomotor. When the rotary engaging member is rotated by the electric actuator, the position where the rotary member is engaged with the elongate engaging member is changed in the longitudinal direction of the elongate member, so that the movable member is moved.

According to another feature of the present invention, the rotary engaging member comprises an internally threaded nut and the elongate engaging member comprises an externally threaded screw.

According to another feature of the present invention, the rotary engaging member comprises a pinion and the elongate engaging member comprises a rack.

According to another feature of the present invention, the EC supplying apparatus further comprises an acceleration detector which detects an acceleration value of the corresponding one movable member, and an acceleration control device which controls an acceleration of the corresponding one movable member, based on the detected acceleration value, according to a reference acceleration control pattern. When the acceleration of movement of each movable member can be controlled according to the reference acceleration control pattern, the speed of movement of each movable member can be changed with accuracy according to a reference speed control pattern. Thus, each movable member can be moved quickly and smoothly while the vibration thereof can be effectively prevented. Accordingly, the efficiency of EC supplying of each EC supplying unit is much improved, and an EC picking-up apparatus, such as an EC mounting apparatus, which picks up ECs from the EC supplying cartridges supported on each movable member is effectively prevented from failing to picking up and holding each EC.

According to another feature of the present invention, the EC supplying apparatus further comprises a small-distance judging device which is provided on at least one of the units and which judges whether a distance between the at least one unit and an adjacent one of the units is shorter than a reference value, and a collision preventing device which controls, when the judging device makes a positive judgement, the movement of at least one of the at least one unit and the adjacent one unit, so as to prevent a collision of the at least one unit and the adjacent one unit. The small-distance judging device may comprise, e.g., a limit switch, a proximity switch, or a photoelectric sensor. In order to prevent all the EC supplying units from colliding with each other, the total number of the small-distance judging devices may be smaller by one than that of the EC supplying units, that is, may be equal to the total number of spaces between each pair of adjacent two units of all the units. For example, a small-distance judging device may be attached to the right-hand side end of each of the units which see at least one unit on the right-hand side thereof, or the left-hand side end of each of the units which see at least one unit on the left-hand side thereof. However, it is not essentially required that a small-distance judging device be attached to each of the units. For example, in the case where the present apparatus has an odd number of EC supplying units, it is possible that a small-distance judging device be attached to each of opposite ends of each of units having even numbers as counted from an end unit of the units and no judging device be attached to each of units having odd numbers. Alternatively, in order to prevent an collision of the units even when one judging device is out of order, a plurality of judging means may be attached to each of the units. Otherwise, in order to prevent each of opposite end units from colliding with a stationary member disposed around it, the total number of the small-distance judging devices employed may be greater by one than that of the units. In the latter case, two judging devices may be attached to at least one of the units, or one judging device may be attached to the stationary member. The reference distance which is compared with an actual distance between two EC supplying units may be the sum of a braking distance needed to stop one of the units which is moving and a predetermined minimum distance between two units which are adjacent to each other. The reference distance may be changed in a plurality of steps, or continuously (i.e., steplessly), depending upon, e.g., the actual mass and/or required steady-state speed of each unit. The collision preventing device may be provided by each movable-member-side control device or the frame-member-side control device. In the case where a first unit having a judging device is moving, if the judging device makes a positive judgment, the preventing device may stop the movement of the first unit, or may move a second unit adjacent to the first unit. In the case where a first unit having a judging device stands stopped and a second unit adjacent to the first unit is moving toward the first unit, the preventing device may stop the movement of the second unit or may move the first unit. In the case where the present apparatus includes a first unit having no judging device, the preventing device may prevent the first unit from colliding with a second unit adjacent to the first unit, by stopping or moving the first unit based on the result detected by a judging device of the second unit. In the case where each of the units has two judging devices attached to opposite ends thereof, each unit can judge that the distance between each unit and a unit adjacent thereto is shorter than the reference distance, based on the results detected by the judging devices thereof, i.e., without needing the results detected by the judging devices of the adjacent unit. Thus, each unit can quickly stop or move to prevent itself from colliding with the adjacent unit. The small-distance judging device and the collision preventing device cooperate with each other to avoid damaging of the units resulting from collision with each other.

According to another feature of the present invention, the EC supplying apparatus further comprises a cartridge-setting-state detecting device which detects a cartridge setting state in which at least one of the cartridges is set on the movable member of the each unit. The cartridge setting state may be an abnormal cartridge setting or an abnormal cartridge distribution as described later. The cartridge-setting-state detecting device may be provided on either each movable member or the frame member or may be separately provided on both each movable member and the frame member. In either case, the state detecting device contributes to preventing each cartridge from colliding with an EC picking-up apparatus, or from failing to supply an EC to the EC picking-up apparatus. If an EC supplying cartridge is not set in a correct posture relative to a movable member and an excessively large space is adversely created between the cartridge and the movable member, there arises some possibility that the cartridge may collide with the EC picking-up apparatus. In addition, if no cartridge is set at a position where a cartridge should be set, the unit fails to supply ECs to the EC picking-up apparatus. However, the present EC supplying apparatus is free from those problems.

According to another feature of the present invention, the cartridge-setting-state detecting device comprises an abnormal-cartridge-setting detector which detects an abnormal cartridge setting in which the at least one cartridge is abnormally set on the movable member of the each unit and provides an abnormality detection signal indicating that the abnormal-cartridge-setting detector has detected the abnormal cartridge setting, and the EC supplying apparatus further comprises an inhibiting device which inhibits, when the abnormal-cartridge-setting detector provides the abnormality detection signal, the each unit from supplying the each component. The abnormal cartridge setting may mean that the entirety, or at least the component supplying portion, of an EC supplying cartridge is not set in a correct posture relative to a movable member, that is, mean that an excessively large space is left between the bottom surface of the cartridge and the top surface of the movable member. The number of the EC supplying cartridges which are actually set on each movable member may, or may not, be equal to the maximum number of cartridges that can be set on each movable member. For example, in the case where the number of sorts of ECs to be supplied is small, a reduced number of cartridges may be set on a movable member. In this case, the mass of the EC supplying unit as a whole is reduced and accordingly the unit can be moved at a higher speed. In the case where the abnormal-cartridge-setting detector is provided on each of the movable members, the detector may comprise at least one cartridge sensor which is associated with each of cartridge setting areas, on each movable member, in which EC supplying cartridges can be set, respectively, as will be detailed in the description of the preferred embodiments. Each cartridge sensor may be provided by a limit switch or a reflection-type or a transmission-type photoelectric switch. Each cartridge sensor is disposed at a position which is predetermined depending upon the sort of the abnormal cartridge setting to be detected. For example, in the case where the abnormal cartridge setting is intended to mean that the entirety of an EC supplying cartridge is set on a movable member such that an excessively large space is left between the cartridge and the movable member, one cartridge sensor may be provided at a position corresponding to a middle position of the length of the cartridge, or two cartridge sensors may be provided at respective positions corresponding to a front and a rear end of the cartridge. In the case where two cartridge sensors are provided at respective positions corresponding to the front and rear ends of each cartridge, information can be obtained about whether each one of the cartridges has an abnormality or not, which one of the front and rear ends of each cartridge has an abnormality, and whether each of the front and rear ends of each cartridge has an abnormality. In the case where the abnormal cartridge setting is intended to mean that the EC supplying portion of an EC supplying cartridge is set on a movable member such that an excessively large space is left between the EC supplying portion and the movable member, one cartridge sensor may be provided at a position corresponding to the EC supplying portion of the cartridge. The abnormality detection signal may comprise a detection signal itself which is produced by each cartridge sensor, or a signal which is produced based on the detection signal, for example, signal indicating that at least one EC supplying cartridge is abnormally set or a signal indicative of at least one cartridge setting area in which at least one cartridge is not set in a normal posture. In the case where the abnormality detection signal is produced based on the respective detection signals produced by all the cartridge sensors, the abnormal-cartridge-setting detector comprises all the cartridge sensors and an abnormality-detection signal producing means for producing the abnormality detection signal. When all the cartridges are normally set, no abnormality detection signal is produced. The abnormal-cartridge-setting detector may be replaced by a normal-cartridge-setting detector which provides a normality detection signal indicating that all the cartridges are normally set. In the case where the abnormal-cartridge-setting detector is separately provided on the side of each movable member and on the side of the frame member, the detector may comprise a reflection-type photoelectric sensor including a reflecting member provided on each cartridge and a light emitting and a receiving element provided on the side of the frame member. In this case, the light amount received by the light receiving element is utilized to judge whether each cartridge is set in a normal posture. A single photoelectric sensor can detect the respective setting states of all the cartridges on one or each EC supplying unit, while one or each movable member is intermittently moved at a pitch equal to a pitch at which the cartridges are set on each movable member. Alternatively, the abnormal-cartridge-setting detector may comprise a transmission-type photoelectric sensor including a punched strip projecting from each cartridge and a light emitting and a receiving element provided on the frame member. The punched strips extend in a direction parallel to the direction of movement of the movable members, and the light is emitted from the light emitter toward the light receiver in a direction perpendicular to the direction of movement of the movable members. When one or each movable member is moved, the cartridges are moved one by one to a punch detecting position where the photoelectric sensor is provided. Each punched strip passes a space between the light emitter and receiver, and the light emitted from the light emitter passes through the punched hole of the strip and is received by the light receiver. The light amount received or detected by the light receiver is used for judging whether each cartridge is set in a normal state. In the case where the abnormal-cartridge-setting detector is provided on the frame member, the detector may comprise an image picking-up device such as a camera which takes an image of each EC supplying unit, and a comparing means for comparing the taken image with a reference image for judging whether each cartridge is set in a normal state on each movable member. In the case where the abnormal-cartridge-setting detector is separately provided on the side of each movable member and on the side of the frame member, the detector may be adapted to generate respective detection signals themselves produced by all the cartridge sensors, or a signal produced based on those detection signals. The inhibiting device may be provided by either the frame-member-side control device or the movable-member-side control devices. In the former case, the abnormal detection signal is sent to the frame-member-side control device via the no-wire-connection information transmitting device. In the case where the respective setting states of the cartridges are sequentially detected by moving each movable member, the inhibiting device may immediately inhibit any further movement of each movable member when just one cartridge is judged as being set in an abnormal state. Alternatively, in the same case, the inhibiting device may inhibit the movement of each movable member, and thereby inhibiting the EC supplying of each unit, after all the setting states of the cartridges are detected by continuing to move each movable member even if one or more cartridges are judged as being set in an abnormal state. Those alternatives may also apply to the case where the respective setting states of the cartridges are sequentially detected with each movable member being stopped. The abnormal-cartridge-setting detector and the inhibiting device cooperate with each other to provide the advantages that when each EC supplying unit is moved, each cartridge is effectively prevented from colliding with, e.g., a component suction nozzle of the EC picking-up apparatus and that the EC supplying portion of each cartridge is effectively prevented from being out of position and accordingly each cartridge is effectively prevented from failing to supplying an EC to the suction nozzle.

According to another feature of the present invention, the cartridge-setting-state detecting device comprises a cartridge-distribution detector which detects a cartridge distribution in which the cartridges are distributed on the movable member of the each unit, and the EC supplying apparatus further comprises an inhibiting device which inhibits, when the detected cartridge distribution is not identical with a reference cartridge distribution, the each unit from supplying the each component. The cartridge distribution comprises information about which one or ones of the cartridge setting areas on each movable member is/are occupied by one or more cartridges. Alternatively, the cartridge distribution comprises information about whether a cartridge is actually set in each of the cartridge setting areas in each of which a cartridge should be set, that is, information about whether no cartridge is actually set in each of those cartridge setting areas, and additionally information about whether no cartridge is actually set in each of the cartridge setting areas in each of which no cartridge should be set, that is, information about whether a cartridge is actually set in each of those cartridge setting areas. Like the abnormal-cartridge-setting detector, the cartridge distribution detector may be provided entirely on the side of each movable member, entirely on the side of the frame member, or separately on the side of each movable member and on the side of the frame member. In the case where the cartridge distribution detector may be provided on each movable member, the detector may comprise at least one cartridge sensor which is associated with each of the cartridge setting areas provided on each movable member. In this case, the cartridge distribution detector may output the respective detection signals of all the cartridge sensors, or may output one or more signals produced based on those detection signals, e.g., a normal distribution signal indicating that a detected cartridge distribution is identical with a reference cartridge distribution, and an abnormal distribution signal indicative of one or more "abnormal" cartridge setting areas including an area in which no cartridge is set although a cartridge should be set and an area in which a cartridge is set although no cartridge should be set. In the latter case, the cartridge distribution detector comprises all the cartridge sensors and a signal producing means for producing the normal and abnormal distribution signals. Information indicative of the reference cartridge distribution may be pre-stored in each movable-member-side control device, or in the frame-member-side control device. The reference cartridge distribution may not be provided on the same side as the side on which the cartridge distribution detector is provided. The inhibiting device may be provided by each movable-member-side control device, or by the frame-member-side control device. In the case where the cartridge distribution detector is separately provided on the side of each movable member and on the side of the frame member, the detector may comprise, like the abnormal-cartridge-setting detector, a reflection-type or transmission-type photoelectric sensor including a reflecting member or a punched strip provided on each cartridge and a light emitting and a receiving element provided on the side of the frame member. In this case, the light amount received by the light receiving element is utilized to judge whether a cartridge is set in each of the cartridge setting areas on each movable member. Thus, the distribution of the cartridges on each movable member is detected. In the case where the cartridge distribution detector is provided on the side of the frame member, the detector may comprise an image picking-up device such as a camera. The inhibiting device may be adapted to immediately inhibit any further proceeding of a cartridge distribution detection when just one cartridge setting area in which no cartridge should be set is judged as being occupied by a cartridge or just one cartridge setting area in which a cartridge should be set is judged as being not occupied by any cartridge. Alternatively, the inhibiting device may inhibit the EC supplying of each unit, when at least one "abnormal" cartridge setting area as indicated above is identified after each cartridge distribution detection is completed on all the cartridges provided on each movable member. In the former case, if a cartridge distribution is detected by moving each movable member, the inhibiting device may immediately inhibit any further movement of the movable member when just one "abnormal" cartridge setting area is found. The cartridge distribution detector and the inhibiting device cooperate with each other to prevent an abnormal cartridge distribution from occurring to each movable member, thereby preventing each EC supplying unit from failing to supply ECs to, e.g., an EC picking-up apparatus.

According to another feature of the present invention, the each cartridge comprises a tape feeding device which feeds a tape having a plurality of pockets in which the electronic components are accommodated, respectively, the tape feeding device intermittently feeding the tape at a feeding pitch which is equal to a distance between each pair of adjacent two pockets of the tape.

According to another feature of the present invention, the information transmitting device comprises means for transmitting, from the frame-side control device to the each movable-member-side control device, the information including control information and addressee information indicative of a particular one of the movable-member-side control devices to which the control information is to be transmitted to control the movable-member-side drive section corresponding to the particular one movable-member-side control device. Since the information transmitted from the common first transmitting section provided on the frame member, to each of the second transmitting sections provided on the respective movable members, includes the addressee information, each of the movable-member-side control devices can select and receive only the information directed to itself, from all the information transmitted from the frame-member-side control device. Thus, the plurality of EC supplying units can be controlled independent of each other though the common first transmitting section is employed.

According to another feature of the present invention, the first transmitting section comprises a first sending and receiving unit, and the each second transmitting section comprises a second sending and receiving unit which sends, to the first sending and receiving unit, information including (a) operating-state information relating to an operating state of a corresponding one of the units and (b) sender information indicative of the corresponding one unit from which the operating-state information is to be sent to the first sending and receiving unit. Since the information sent from each second sending and receiving unit to the common first sending and receiving unit includes the sender information, the frame-member-side control device identify from which movable-member-side control device the information has been sent thereto. Thus, the respective operating states of the EC supplying units can be grasped and responded to independent of each other.

According to another feature of the present invention, the each movable-member-side drive section comprises a first toothed member which is fixed to the corresponding one movable member and which includes a plurality of teeth and an energizing coil which energizes the first toothed member, and the frame-member-side drive section comprises a second toothed member which is fixed to the frame member and which includes a plurality of teeth which are opposed to the teeth of the first toothed member, the first and second toothed members cooperating with each other to provide a linear motor. In this embodiment, the movable-member-side drive sections and the frame-member-side drive section cooperate with each other to provide an electric actuator. The number of parts needed to provide the linear motor is smaller than the number of parts needed to provide the rotary engaging members, the elongate engaging member, and the electric actuator which rotates each rotary member to move a corresponding movable member. Thus, the present apparatus enjoys a simple construction. The linear motor may be provided by a PM (permanent magnet) type linear motor as will be detailed in the description of the preferred embodiments, or may be provided by a VR (variable reactance) type linear motor or a HB (hybrid) type linear motor.

BRIEF DESCRIPTION OF THE DRAWINGS

The above and optional objects, features and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
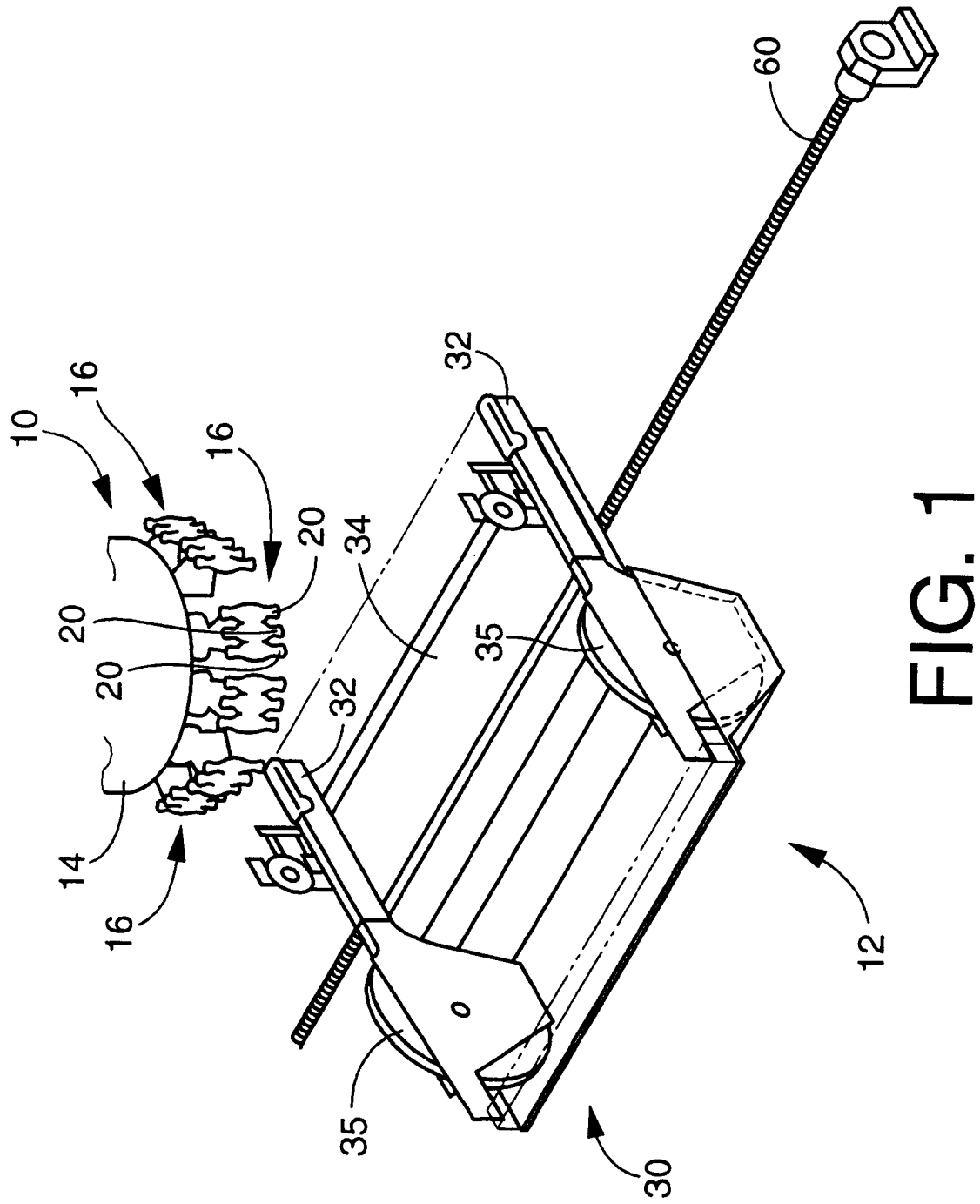
FIG. 1 is a perspective, illustrative view of an electronic component ("EC") supplying apparatus to which the present invention is applied, and an EC mounting apparatus.

Referring first to FIG. 1, there will be described an electronic component ("EC") supplying apparatus 12 to which the present invention is applied.

In FIG. 1, reference numeral 10 designates an EC mounting apparatus 10 which is used with the EC supplying apparatus 12. The EC mounting apparatus 10 includes an index table 14 which is intermittently rotatable about a vertical axis line. The index table 14 includes twelve component suction units 16, and is intermittently rotated by an intermittently rotating device (not shown) which is provided by a cam, a cam follower, an axis member, an index servomotor which rotates the cam, and other elements so that the twelve suction units 16 are sequentially moved to an EC sucking position, an EC image taking position, an EC posture correcting position, an EC mounting position, etc. As the index table 14 is rotated, each of the twelve suction units 16 is moved up and down by the cooperation of a stationary cam (not shown), a cam follower (not shown) provided on each suction unit 16, etc. Thus, at the EC sucking position, each suction unit 16 sucks an EC at a height higher than that at which each suction unit 16 mounts the EC on a printed circuit ("PC") board at the EC mounting position. Each suction unit 16 includes three component suction heads 20 one of which is selectively positioned at an operating position to suck and mount the EC.

At the EC mounting position, there is disposed a PC board moving device (not shown) which supports the PC board, on which ECs are to be mounted, and which moves the PC in an X-axis direction and an Y-axis direction which are perpendicular to each other so that each EC may be mounted on an appropriate mounting place on the PC board.

Figure 2:
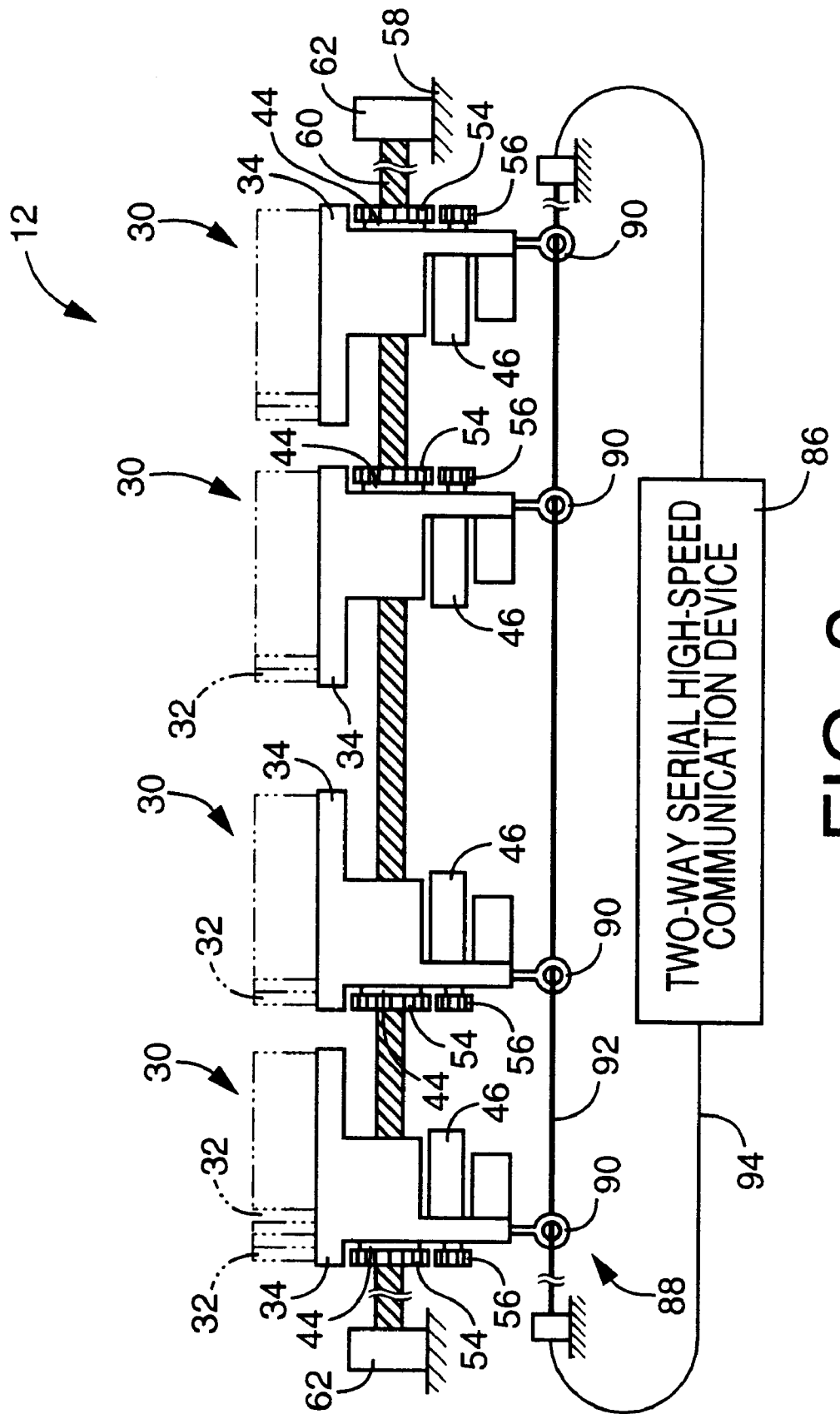
FIG. 2 is an illustrative view of the EC supplying apparatus of FIG. 1 including a no-connection information transmitting device.

At the EC sucking position, there is disposed the EC supplying apparatus 12. As shown in FIG. 2, the EC supplying apparatus 12 includes four component supplying units 30 (only one 30 is shown in FIG. 2). Since the three supplying units 30 has the same construction, there will be described one supplying unit 30 in detail below.

The component supplying unit 30 includes a plurality of EC supplying cartridges 32, and a movable member in the form of a movable table 34 which supports the cartridges 32. Each cartridge supplies ECs carried by a carrier tape (not shown). A carrier tape includes a component holder tape having a plurality of pockets which are provided at a predetermined pitch and which accommodate a plurality of ECs, respectively, and a cover tape which covers the respective upper openings of the pockets of the holder tape. The carrier tape is wound around a supply reel 35 (FIG. 1) of each cartridge 32, and is intermittently fed by a feeding device (not shown) at a feeding pitch which is equal to the pitch of provision of the pockets on the carrier tape while the cover tape is peeled off in a component supplying portion of each cartridge 32. Thus, the EC held in the leading one of the pockets from which the cover tape has been peeled off, is positioned at an EC picking-up position provided in the EC supplying portion. The EC supplying portion of each cartridge 32 is provided by a front portion thereof which is nearer to the EC mounting apparatus 10 than a rear portion thereof.

The plurality of EC supplying cartridges 32 are set on the movable table 34 such that the respective component supplying portions of the cartridges 32 are arranged along a reference straight line along which the movable table 34 is moved. The movable table 34 has a plurality of cartridge setting areas with each of which a cartridge positioning device (not shown) and a cartridge fixing device (not shown) are associated. The cartridge positioning device positions the cartridge 32 in the cartridge setting area on the movable table 34, and the cartridge fixing device fixes the cartridge 32 positioned in the cartridge setting area, to the movable table 34. A front and a rear cartridge sensor 36, 37 (FIG. 4) are provided in a association with a front and a rear portion of each cartridge setting area on the movable table 34, respectively. Each cartridge setting area is elongate in a direction perpendicular to a direction in which the movable table 34 is moved, i.e., the above-indicated reference straight line. With each cartridge 32 being set in the cartridge setting area, the cartridge 32 and the cartridge setting area extend parallel to each other on the table 34.

Each of the front and rear cartridge sensors 36, 37 is provided by a transmission type photoelectric detector, and includes a light emitting element and a light receiving element which are spaced from each other in a widthwise direction of each cartridge setting area which is parallel to the direction of movement of the movable table 34 and is perpendicular to the longitudinal direction of each cartridge 32 set in the cartridge setting area. Each cartridge 32 has a front and a rear through-hole (not shown) which are formed through a widthwise thickness thereof. The light emitted from the light emitter of the front or rear cartridge sensor 36, 37 passes through the front or rear through-hole and is received by the light receiver of the same sensor 36, 37. The light receiver of each sensor 36, 37 supplies a detection signal indicative of the received light amount or intensity, to a computer 38 provided on the movable table 34.

In the present EC supplying apparatus 12, the front and rear through-holes of each cartridge 32 are formed such that with each cartridge 32 being set on the movable table 34, the center line of each of the front and rear through-holes is slightly offset upward from the optical axis line of a corresponding one of the front and rear cartridge sensors 36, 37 along which the light emitted from the light emitter travels toward the light receiver. Providing that the light amount received by the light receiver when each cartridge 32 is not set on the movable table 34 is 100, the light amount received by the light receiver when each cartridge 32 is correctly set in the cartridge setting area is about 40 to 60. Therefore, if the light amount received by the light receiver of each cartridge sensor 36, 37 is just 100 or a value around 100, the computer 38 can judge that no cartridge 32 is set in the cartridge setting area with which each cartridge sensor 36, 37 is associated. In addition, if a portion, or an entirety, of each cartridge 32 is incorrectly or inappropriately set in the cartridge setting area, with an inappropriate spacing being produced between the portion or the entirety and the cartridge setting area because, for example, the cartridge positioning or fixing device is out of order for some reason, the light amount received by the light receiver is smaller than the normal range of 40 to 60. Thus, the inappropriate setting of each cartridge 32 on the movable table 34 can be detected.

Even if the cartridges 32 may be correctly set in the cartridge setting areas on the movable table 34, respectively, the light amounts detected by the respective cartridge sensors 36, 37 associated with the cartridge setting areas may differ from each other because of the manufacturing errors of the cartridges 32 and/or the table 34, the normal variation of the light amounts emitted by the respective light emitters of the sensors 36, 37, the normal variation of the light amounts received by the respective light receivers of the sensors 36, 37, etc. In order to calibrate each of the cartridge sensors 36, 37, an light amount is detected by each sensor 36, 37, with a cartridge 32 being appropriately set in the cartridge setting area with which each sensor 36, 37 is associated, when each sensor 36, 37 is attached to the table 34. The computer 38 determines a normal light-amount range by adding, and subtracting, a predetermined value to, and from, the light amount detected by each sensor 36, 37. Thus, the computer 38 determines the respective normal light-amount ranges of all the cartridge sensors 36, 37 mounted on the movable table 34, and stores data representing the determined ranges in a non-volatile memory (e.g., ROM (read only memory), back-up RAM (random access memory), external memory device, etc.). The respective normal light-amount ranges of almost all the cartridge sensors 36, 37 fall within the range of 40 to 60.

The ROM of the computer 38 stores a cartridge-setting-state judging program according to which a CPU (central processing unit) of the computer 38 judges whether the cartridges 32 are normally distributed on the table 34, and whether each cartridge 32 is appropriately set on the table 34. According to this program, the computer 38 or the CPU sets or resets each of a cartridge-absence flag and a normal-cartridge-setting flag, for each of all the cartridge sensors 36, 37 provided in association with the cartridge setting areas on the table 34. The cartridge-absence flags and the normal-cartridge-setting flags are provided in the RAM of the computer 38. In other words, the computer 38 sets or resets one cartridge-absence flag and one normal-cartridge-setting flag corresponding to each of all the cartridge sensors 36, 37, based on a detection signal which is supplied thereto from each sensor 36, 37 and which is indicative of a light amount detected by each sensor 36, 37.

If the light amount received by the light receiver of each sensor 36, 37 is not less than a predetermined value around 100 (e.g., 90), the computer 38 sets, to "1", the cartridge-absence flag corresponding to that sensor 36, 37. On the other hand, if the light amount is less than the predetermined value, the computer 38 resets the cartridge-absence flag to "0". If the light amount received by the light receiver of each sensor 36, 37 falls with the calibrated and then stored normal light-amount range of that sensor 36, 37, that means that the cartridge 32 is appropriately set in the cartridge setting area with which that sensor 36, 37 is associated. Therefore, the computer 38 sets, to "1", the normal-cartridge-setting flag corresponding to that sensor 36, 37. On the other hand, if the light amount does not fall within the normal range, that means that the cartridge 32 is set in the cartridge setting area but the setting state is inappropriate or abnormal. Thus, the computer 38 resets the normal-cartridge-setting flag to "0".

After the computer 38 sets or resets all the cartridge-absence flags and all the normal-cartridge-setting flags based on the detection signals supplied thereto from all the cartridge sensors 36, 37, the computer 38 judges whether a cartridge 32 is set in each of all the cartridge setting areas provided on the table 34, based on the setting or resetting state ("1" or "0" value) of each of all the cartridge-absence flags. If both of the two cartridge-absence flags associated with each cartridge setting area are set to "1", the computer 38 judges that no cartridge 32 is not set in that cartridge setting area. On the other hand, if both of the two cartridge-absence flags are reset to "0", the computer 38 judges that a cartridge 32 is set in that cartridge setting area. In a third case in which one of the two cartridge-absence flags is set to "1" and the other is reset to "0", the computer 38 judges that some abnormality has occurred to the cartridge 32 being set in the cartridge setting area.

After the computer 38 judges whether a cartridge 32 is set in each of all the cartridge setting areas in this way, then the computer 38 determines a distribution of the cartridges 32 on the table 34 and compares the thus determined cartridge distributing state with a nominal cartridge distributing state which is pre-stored in the non-volatile memory of the computer 38. If the two distributing states are identical with each other, the computer 38 outputs a normal-distribution signal. On the other hand, if the two distributing states are not identical with each other, the computer 38 outputs an abnormal-distribution signal. Also in the above-indicated third case in which one of the two cartridge-absence flags associated with each cartridge setting area is set to "1" and the other is reset to "0", the computer 38 outputs the abnormal-distribution signal, irrespective of whether a cartridge 32 should be set in that cartridge setting area or not.

Thus, the abnormal distribution signal can transmit three kinds of abnormal information; the first information is that no cartridge 32 is set in each cartridge setting area in which a cartridge 32 should be set; the second information is that a cartridge 32 is set in each cartridge setting area in which no cartridge 32 should be set; and the third information is that one of the two cartridge-absence flags associated with each cartridge setting area is set to "1" and the other is reset to "0". The abnormal-distribution signal may contain two kinds of abnormal information with respect to each cartridge setting area, or may contain the same kind of abnormal information with respect to two or more cartridge setting areas. Thus, the abnormal-distribution signal output from the computer 38 contains all the abnormalities identified from all the cartridge-absence flags.

Subsequently, the computer 38 judges whether each of all the cartridges 32 being set on the table 34 is appropriately set with respect to a cartridge setting area, based on the setting or resetting state ("1" or "0" value) of each of the normal-cartridge-setting flags. If all the normal-cartridge-setting flags are set to "1" except for one or ones associated with the cartridge setting area or areas for which no cartridge setting has been found by the computer 38 at the time of determination of the cartridge distributing state, the computer 38 outputs a normal cartridge-setting signal. On the other hand, if at least one of the normal-cartridge-setting flags in question is reset to "0", the computer 38 outputs an abnormal cartridge-setting signal. Thus, the abnormal cartridge-setting signal contains information about whether or not an abnormal setting has occurred to each of the front and rear portions of each cartridge 32 being set on the table 34.

Figure 4:
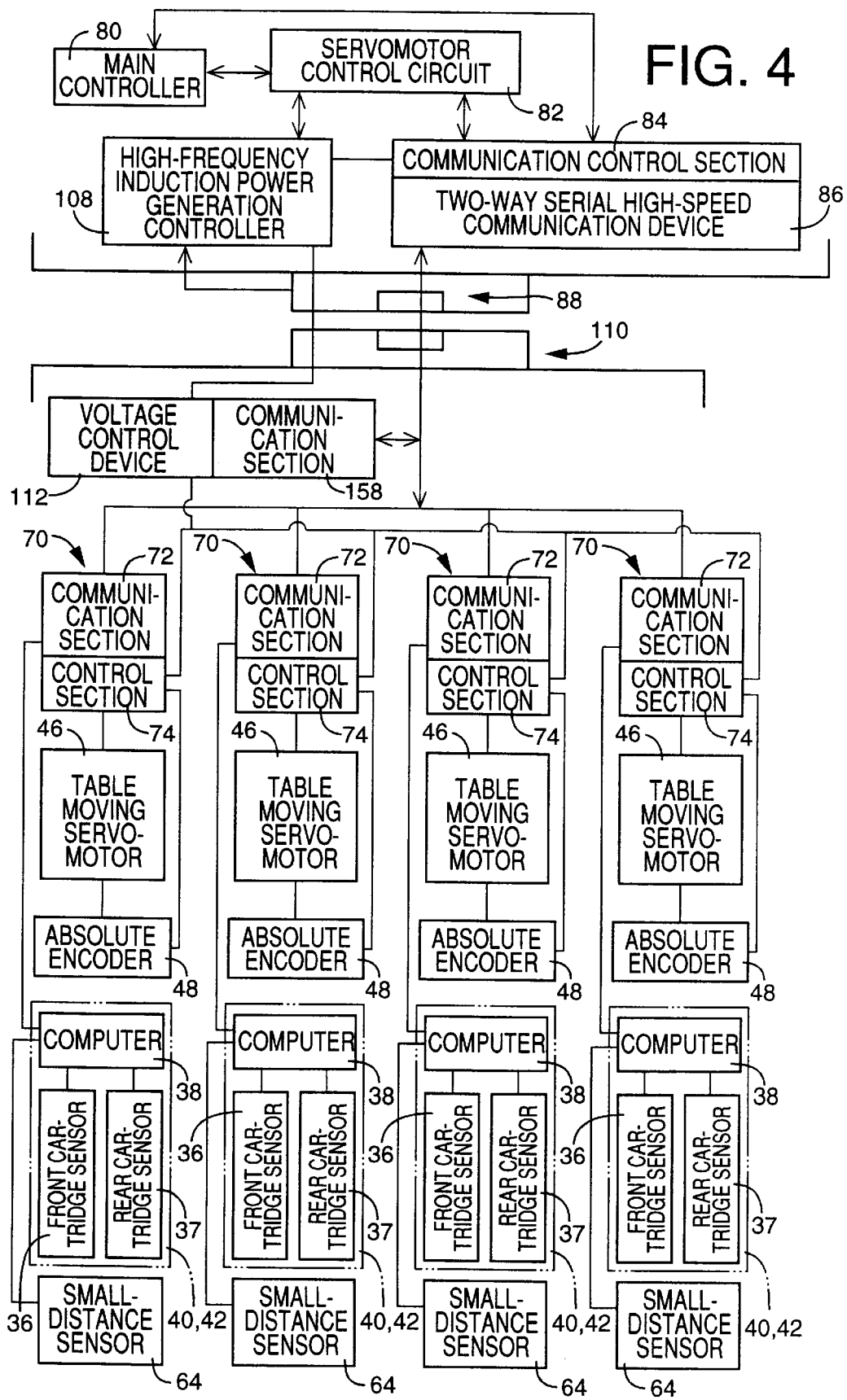
FIG. 4 is a view illustrating the manner in which respective component supplying units of the EC supplying apparatus of FIG. 1 are supplied with electric energy and control information.

All the cartridge sensors 36, 37 associated with the cartridge setting areas on the movable table 34, and a portion of the computer 38 which outputs the normal or abnormal distribution signal based on the detection signals supplied from the sensors 36, 37, cooperate with each other to provide a cartridge distribution detector 40 (FIG. 4). All the cartridge sensors 36, 37 associated with the cartridge setting areas on the movable table 34, and a portion of the computer 38 which outputs the normal or abnormal cartridge-setting signal based on the detection signals supplied from the sensors 36, 37, cooperate with each other to provide a cartridge setting-state detector 42 (FIG. 4).

As shown in FIG. 2, the movable table 34 is provided with an internally threaded nut 44 which is rotatable about an axis line which is parallel to the reference straight line along which the respective component supplying portions of the cartridges 32 are arranged. The nut 44 is rotated by a table moving servomotor 46 which is mounted on the table 34. A first timing gear 54 is fixed to one end of the nut 44, and a second timing gear 56 is fixed to an output shaft of the motor 46. The first and second timing gears 54, 56 are connected by a cog belt (not shown), so that the rotation of the output shaft of the motor 46 is transmitted to the nut 44 via the gears 54, 56 and the cog belt. Thus, the nut 44 is rotated by the motor 46.

Figure 5:
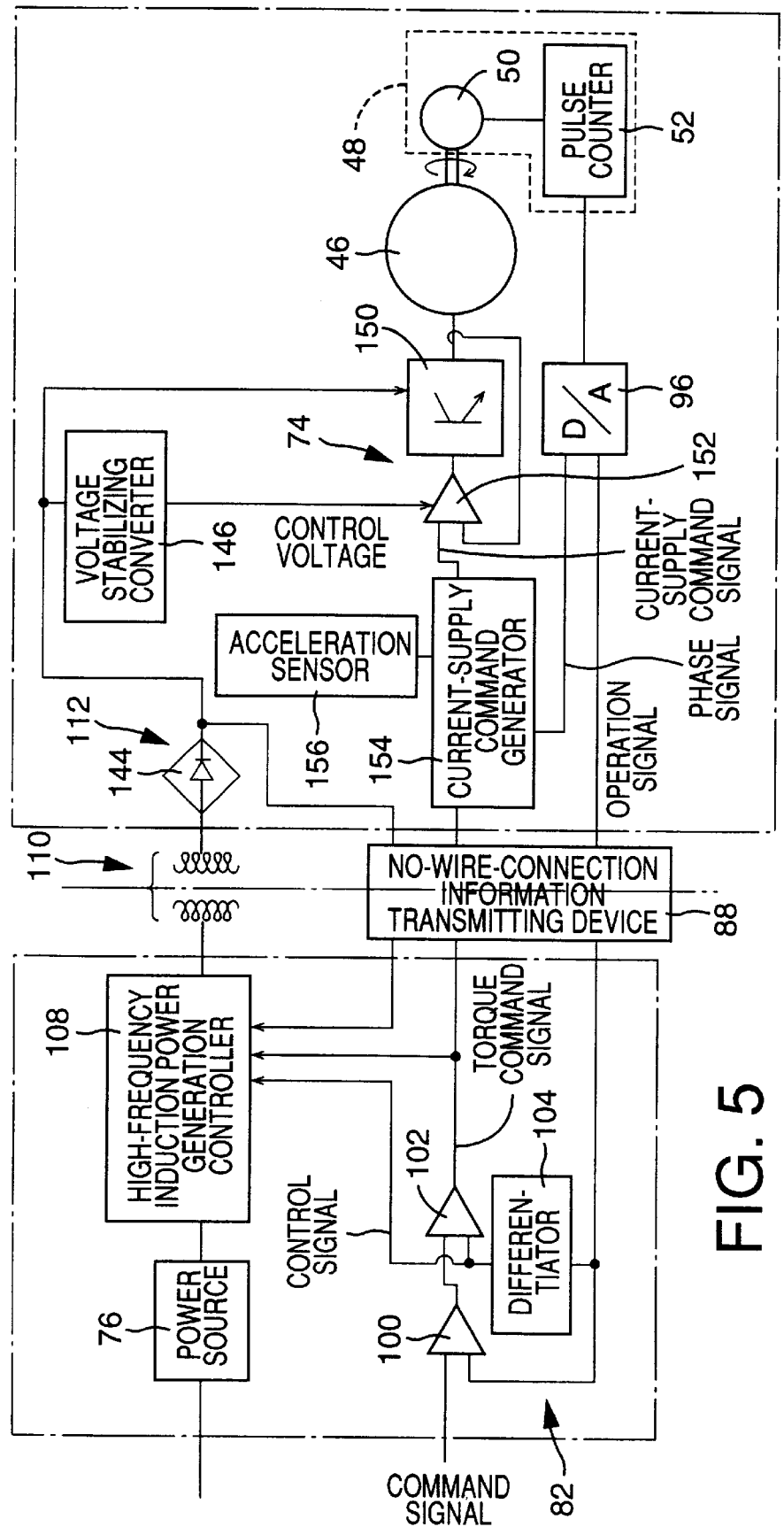
FIG. 5 is a view of a control circuit which controls a servomotor employed in the EC supplying apparatus of FIG. 1.

The table moving servomotor 46 is provided by a brush-less DC (direct current) motor that does not have a brush or a commutator. The rotation position of the motor 46 is detected by an electronic absolute encoder 48 (FIG. 4). As shown in FIG. 5, the absolute encoder 48 includes an incremental encoder 50 and a pulse counter 52. As the motor 46 is rotated, the incremental encoder 50 outputs a pulse signal representing a phase different by 90° from the current phase of the motor 46. In addition, when the motor 46 takes an origin rotation position, the encoder 50 outputs an origin signal. The pulse counter 52 counts the number of pulse signals, and the number of origin signals, output from the encoder 50. When the encoder 50 is rotated in one direction, the counter 52 increases the counted number; and when the encoder 50 is rotated in the opposite direction, the counter 52 decreases the counted number. The absolute encoder 48 is supplied with an electric power from a battery (not shown). Therefore, even if a main power source is cut from the EC supplying apparatus 12, the encoder 48 is operable and the output values of the encoder 48 always indicate the absolute rotation position of the motor 46.

As shown in FIG. 2, the nut 44 of each of the four movable tables 34 is meshed with the an externally threaded ball screw 60 which is provided on a base 58 as a frame member of the EC supplying apparatus 12. The ball screw 60 is supported by a pair of support members 62 fixed to the base 58, such that the screw 60 is not movable in an axial direction thereof and is not rotatable about an axis line. When the nut 44 is rotated by the table moving servomotor 46, the table 34 is moved along the ball screw 60. The axis line of rotation of the nut 44 extends parallel to the direction in which the respective component supplying portions of the cartridges 32 are arranged, and accordingly the table 34 is moved in that direction.

In the present embodiment, the nut 44, the table moving servomotor 46, the ball screw 60, etc. cooperate with one another to provide a table moving device as a movable-member moving device. The ball screw 60 is shared by four table moving devices. However, the respective motors 46 of the four table moving devices are driven independently of one another and accordingly the four tables 34 are moved independently of one another. Each of the four component supplying units 30 is movable within an EC supplying area provided along the ball screw 60 so as to supply the ECs to the EC mounting apparatus 10, and is movable between the EC supplying area and a waiting area which is also provided along the ball screw 60 but does not overlap the EC supplying area. When each supplying unit 30 is positioned in the waiting area, that unit 30 does not interfere with the movement of another unit 30 within the EC supplying area to supply the ECs to the EC mounting apparatus 10.

While each component suction unit 16 is moved to the EC sucking position as the index table 14 is rotated, each EC supplying cartridge 32 is moved to an EC supplying position where the EC supplying portion of each cartridge 32 is positioned right below one of the three component suction heads 20 of each suction unit 16 which head is positioned at the operating position. At the EC supplying position, each cartridge 32 supplies the ECs to the EC mounting apparatus 10.

The single EC supplying area is provided along the ball screw 60 such that the EC supplying position of the EC supplying apparatus 12 is located at the center of the EC supplying area in the direction in which each table 34 is moved. Two waiting areas are provided on both sides of the EC supplying area, respectively. The EC supplying area has a length which is twice longer than the width of each table 34 as measured in the direction of movement of the same 34. Each waiting area has a length which is three times longer than the width of each table 34.

Each of the four movable tables 34 is provided with a small-distance sensor 64 (FIG. 4) which detects that a distance between each table 34 and an adjacent table 34 is shorter than a reference value. The reference value is the sum of a minimum distance between each pair of adjacent tables 34 and a braking distance needed to stop each table 34 when each table 34 is moved at the highest speed. Each small-distance sensor 64 is provided by a proximity switch, which is fixed to a first one of side surfaces of each table 34 in the direction of movement thereof. The respective first side surfaces of the four tables 34 to which the four sensors 64 are fixed, respectively, are nearer to one of the two support members 62 than the other, second side surfaces of the tables 34, respectively. Thus, each sensor 64 is provided on the first side surface of each table 34 which is opposed to the second side surface of an adjacent table 34. However, one sensor 64 is provided on the first side surface of the table 34 at one end along the ball screw 60 is opposed to the above-indicated one support member 62. A fifth sensor 64 is provided on the other support member 62 which is opposed to the second side surface of the table 34 at the other end. The five small-distance sensors 64 supplies respective detection signals to the corresponding computers 38, respectively.

At the EC sucking position, there is also provided an EC-suction-head elevating and lowering device (not shown) which elevates and lowers the operative one of the component suction heads 20 of each component suction unit 16. The elevating and lowering device includes an elevator member, a cam, a cam follower, etc. and additionally includes a motion transmitting device which converts the rotation of the index servomotor which is mainly provided for intermittently rotating the index table 14, into the upward and downward movements of the elevator member. As the elevator member is moved downward, the component suction head 20 is moved downward so as to suck the EC positioned at the EC picking-up position on the EC supplying cartridge 32 positioned at the EC supplying position. As the elevator member is moved upward, the suction head 20 is also moved upward. Another component-suction-head elevating and lowering device (not shown) is provided at the EC mounting position.

At the EC sucking position, there is also provided an operating device (not shown) which operates a tape feeding device (not shown) of the EC supplying cartridge 32 positioned at the EC supplying position. The operating device is driven by the index servomotor for feeding the carrier tape after the EC is picked up by the suction head 20.

As shown in FIG. 4, each of the four tables 34 is provided with a servomotor control device 70 which controls the table moving servomotor 46. Each of the four servomotor control devices 70 includes a movable-member-side sending and receiving unit in the form of a communication section 72, and a movable-member-side control section 74. The communication section 72 receives or sends information needed to control the motor 46, for example, torque command signal, feed-back signal, various output signals of the computer 38 (including the detection signal supplied from the small-distance sensor 64), etc. The control section 74 controls, based on the information received by the communication section 72, an electric energy supplied from a power source 76 which is provided stationarily with respect to the base 58. The power source 76 may be provided fixedly on the base 58, or may be provided fixedly at a position away from the base 58.

The EC supplying apparatus 12 includes a support frame (not shown) which cooperates with the base 58 to provide the frame member. The support frame supports a main controller 80 which controls all the devices needed to mount the ECs on the PC board, e.g., the EC supplying apparatus 12, the EC mounting apparatus 10, and the PC board moving device. The main controller 80 is essentially provided by a computer, and controls respective actuators of the EC supplying apparatus 12, the EC mounting apparatus 10, the PC board moving device via respective control circuits which are not shown in FIG. 4 except for a servomotor control circuit 82 which controls the four table moving servomotors 34 provided on the four tables 34.

The main controller 80 supplies, to the servomotor control circuit 82, command information needed to control the respective table moving servomotors 46 of the four component supplying units 30. The command information is transmitted by a frame-member-side sending and receiving unit in the form of a two-way serial high-speed communication device 86 which belongs to a communication control section 84, to the respective communication sections 72 of the four servomotor control devices 70 via a no-connection information transmitting device 88. The main controller 80 has the function of determining, according to the EC mounting control program, a table speed control pattern which is used to control the speed of rotation of each table moving servomotor 46 and determines, according to the control pattern, target rotation positions of each motor 46 at very short intervals of time. The main controller 80 supplies, to the servomotor control circuit 82, command signals representing the thus determined target rotation positions of each motor 46.

As shown in FIG. 2, the no-connection information transmitting device 88 includes four table-side sending and receiving coils 90 which are provided on the four tables 34, respectively, and a base-side sending and receiving coil 92 which is provided on the base 58. The base-side coil 92 is provided along the ball screw 60 over the EC supplying area and the two waiting areas on both sides of the EC supplying area, such that the coil 92 extends parallel to the direction of movement of the tables 34. The base-side coil 92 is connected to the two-way serial high-speed communication device 86 via a signal cable 94. Each table-side coil 90 includes a ring portion, and the base-side coil 92 passes through the ring portion of each table-side coil 90 such that the table-side coil 90 is movable relative to the base-side coil 92. Each of the table-side and base-side coils 90, 92 is covered by a shield member (not shown).

In the two-way serial high-speed communication device 88, a high frequency carrier wave is modulated based on an analog signal to be transmitted. This modulation may be amplitude modulation, frequency modulation, or phase modulation. In the case where the carrier wave consists of a series of periodic pulses, the pulse amplitude, pulse width, or pulse frequency of the carrier wave may be modulated. The thus modulated carrier wave is demodulated by each communication section 72.

It is required that the four torque command signals as the command signals supplied from the servomotor control circuit 82 be transmitted to the four component supplying units 30, respectively, separately from one another and separately from the respective feed-back signals of the four tables 34 and the output signals of the four computers 38 which are also required to be transmitted separately from one another. The base-side sending and receiving coil 92 of the no-connection information transmitting device 92 is, however, commonly used for transmitting all the signals, and accordingly the two-way serial high-speed communication device 86 of the communication control section 84 is utilized. The communication control section 84 on the side of the base 58 transmits, before transmission of a control signal, an addressee signal indicative of a particular one of the four communication sections 72 to which the control signal is to be transmitted. Each of the four communication sections 72 receives only the control signals each having the addressee signal indicative of itself. More specifically described, each section 72 makes itself be ready for receiving a control signal upon reception of an addressee signal indicative of itself, and sends a ready signal back to the communication control section 84. In response to the ready signal, the control section 84 supplies a torque command signal to that communication section 72 so that the section 72 receives the command signal.

Similarly, each of the four communication sections 72 transmits a feed-back signal, or an output signal of the computer 38, to the communication control section 84, a high frequency carrier wave is modulated based on the signal to be transmitted. The thus modulated carrier wave is demodulated by the two-wave serial high-speed communication device 86. When each section 72 sends a feed-back or computer-output signal to the control section 84, first, a call signal is sent to the control section 84. If the control section 84 sends back a ready signal in response to the call signal, the feed-back or output signal is sent from each section 72 to the control section 84 after a sender signal indicative of that section 72 itself has been added to the head of the feed-back or computer-output signal. Thus, the control section 84 can receive the respective signals supplied from the four communication sections 72, separately from one another. Thus, the four computers 38 can send the respective abnormal cartridge distribution signals and the respective abnormal cartridge setting signals, to the main controller 80. The respective output signals of the four absolute encoders 48 are digital signals each of which is converted into an analog signal by a digital to analog (D/A) converter 96, as shown in FIG. 5. Each communication section 72 modulates a high frequency carrier wave based on the thus converted analog signal, and the modulated carrier wave is transmitted by the no-connection information transmitting device 88.

In FIG. 4, the no-connection information transmitting device 88 is shown for illustrative purposes only.

FIG. 5 shows a control circuit which controls one of the four table moving servomotors 46. However, in FIG. 5, the communication control section 84 and the communication section 72 of the servomotor control device 70 are not shown for the purpose of easier understanding only. Each of the four motors 46 is controlled by a control circuit similar to that shown in FIG. 5.

The servomotor control circuit 82 includes a position amplifier 100, a speed amplifier 102, and a differentiator 104. The position amplifier 100 receives a command signal in the form of an analog signal converted from command information in the form of a digital signal supplied from the main controller 80, and an operation signal as operation information supplied from the absolute encoder 48 which detects the rotation position of the table moving servomotor 46.

The speed amplifier 102 receives the output signal of the position amplifier 100, and a control signal which is produced by the differentiator 104 by differentiating the output signal of the encoder 48. The two amplifiers 100, 102 cooperate with each other to produce a torque command signal based on the above-indicated command signal and the respective values represented by the feed-back operation and control signals. This torque command signal is supplied to the servomotor control device 70 provided on the table 34, via the no-connection information transmitting device 88.

A drive current to drive the servomotor 46 is supplied from the power source 76 to a voltage control device 112 provided on the table 34, via a high frequency induction power generation controller 108 and a no-connection electric-power supplying device 110.

Figure 3:
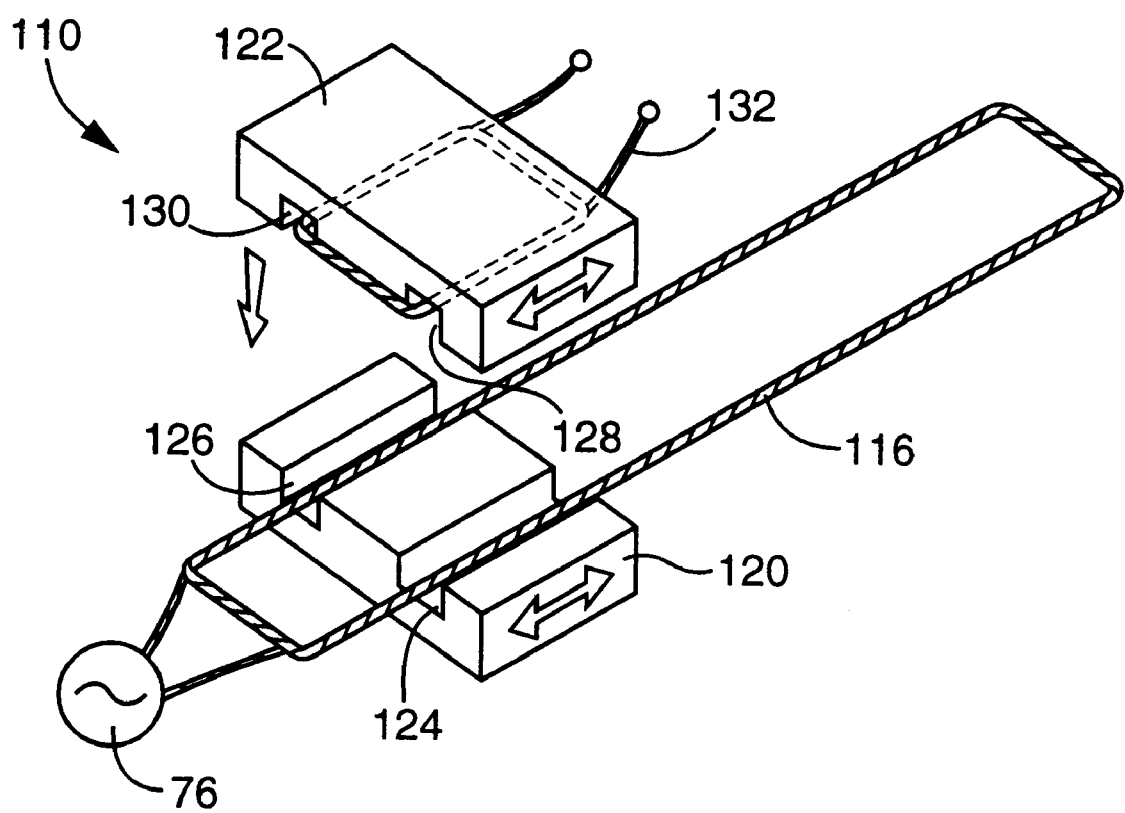
FIG. 3 is a perspective view of the EC supplying apparatus of FIG. 1 including a no-connection electricity supplying device.

As shown in FIG. 3, the no-connection electric-power supplying device 110 includes a primary coil 116 provided on the base 58. The primary coil 116 contributes to reducing the skin effect due to the high frequency wave, because the coil 116 is obtained by stranding a plurality of thin stranded lines into a stranded cord, and winding the stranded corded two or three times. Opposite ends of the primary coil 116 are connected to the power source 76. The primary 116 is provided along the ball screw 60 over the EC supplying area and the two waiting areas on both sides of the EC supplying area, i.e., over the entire area within which the four tables 34 are movable.

A primary core 120 and a secondary core 122 are fixed to each table 34. The primary core 120 has two slots 124, 126 which extend parallel to each other. The primary coil 116 passes through the two clots 124, 126 of the primary core 120. The primary core 120 is formed of an amorphous magnetic material, such as a ferrite or an amorphous alloy, which enjoys a low iron loss in spite of the high frequency wave.

The secondary core 122 is formed of an amorphous magnetic material like the primary core 120, and has two slots 128, 130 which extend parallel to each other. A secondary coil 132 is wound around the secondary core 122 such that the coil 132 passes through the slots 128, 130. Like the primary coil 116, the secondary coil 132 is obtained by stranding a plurality of thin stranded lines into a stranded cord. The no-connection electric-power supplying device 110 is not required to transform an input voltage and accordingly the number of turns of the secondary coil 132 is equal to that of the primary coil 116. The secondary coil 122 is fixed to the table 34, at a position adjacent to the position where the table-side sending and receiving coil 90 is fixed. The primary core 120 is fixed to the secondary core 122 with the help of a fixing device (not shown).

Figure 6:
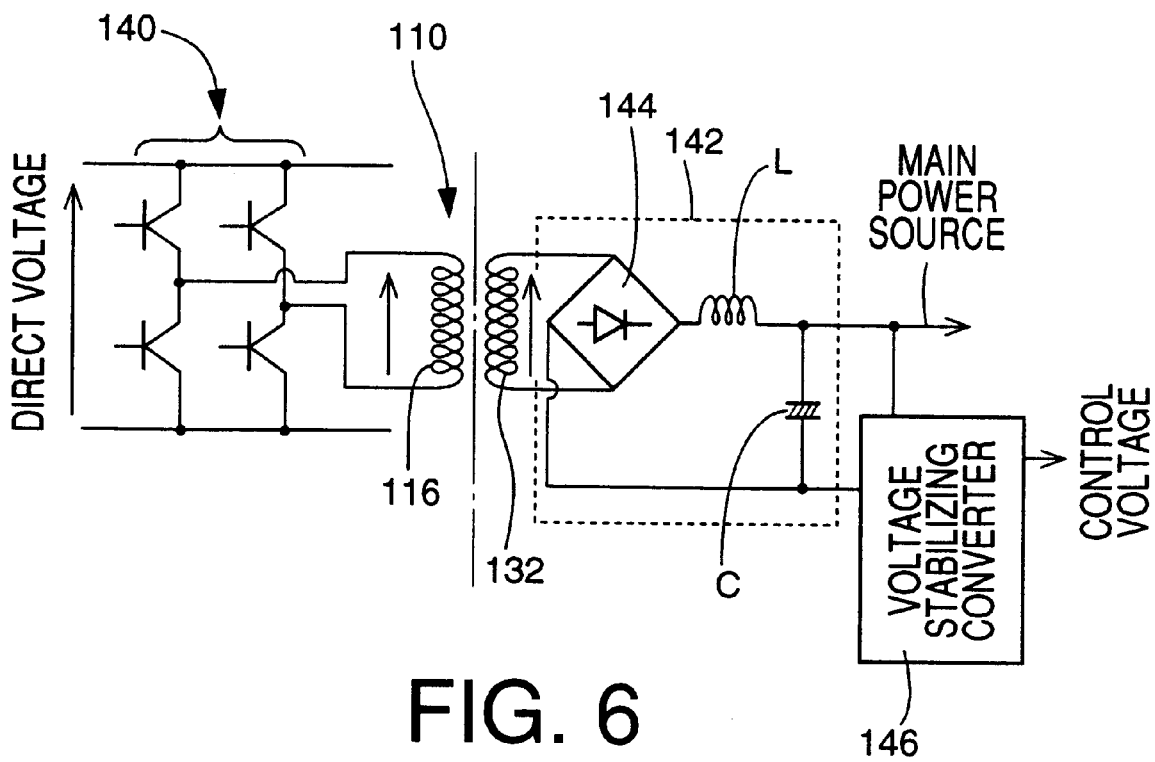
FIG. 6 is a view of a high-frequency induction electric-power generation controller and a rectifying circuit.

The primary coil 116 is energized at high frequency. As shown in FIGS. 5 and 6, the voltage of the power source 76 is converted into a high frequency voltage by a transistor switch 140 which provides the high frequency induction power generation controller 108. Thus, a rectangular-wave voltage (or a sine-curve voltage) corresponding to the ratio of the number of turns of the primary coil 116 to that of the secondary coil 132, is produced in the secondary coil 132. This voltage is full-rectified by a rectifying circuit 142 which is provided on the table 34 and is provided by a high frequency diode bridge 144 and an LC filter including a reactor, L, and a smoothing capacitor, C. The thus-obtained direct current is utilized as a main direct current which drives the table moving servomotor 46 provided on the table 34. A voltage stabilizing converter 146 as a regulator which stabilizes a portion of the above-indicated main direct current, is provided on the table 34. The rectifying circuit 142 and the voltage stabilizing converter 146 cooperate with each other to provide a voltage control device 112 shown in FIG. 5. The table-side sending and receiving coil 90 which is provided adjacent to the primary and secondary cores 120, 122 on the table 34, is covered by the shield member (not shown), and the base-side sending and receiving coil 92 is also covered by the shield member, as described previously. Thus, the information transmitted by the no-connection information transmitting device 88 is not influenced by the electric energy supplied by the no-connection electric-power supplying device 110, and the intact and noise-free information is transmitted.

As shown in FIG. 5, each of the four control sections 74 includes a power switch 150, a current amplifier 152, and a current-supply command generator 154. The command generator 154 generates a current-supply command signal based on a torque command signal transmitted by the no-connection information transmitting device 88, a position signal indicative of a rotation position of the servomotor 46 supplied from the absolute encoder 48 via the D/A converter 96, and an acceleration signal indicative of an acceleration value of the table 34 supplied from an acceleration sensor 156. The current-supply command signal is supplied to the current amplifier 152. A feed-back signal as a detection signal indicative of a detected value of the electric current supplied to the servomotor 46 is also input to the current amplifier 152, which amplifies the current-supply command signal based on the difference between the command signal and the detection signal and produces the current-supply command signal in the form of a PWM (pulse width modulation) wave based on comparison with a triangular wave. The thus produced command signal is supplied to the power switch 150.

The power switch 150 is provided by a power transistor, MOSFET (metal oxide semiconductor field-effect transistor), IGBT (insulated gate bipolar transistor), etc. The output signal of the current amplifier 152 is input to an amplifier (not show) which supplies a drive signal to the base (or gate) of the power switch 150. The current amplifier 152 receives a control voltage controlled and stabilized by the voltage stabilizing converter 146. The power switch 150 modulates the main direct current supplied from the rectifying circuit 142, according to the drive signal as the output signal of the current amplifier 152, and supplies, to the servomotor 46, the PWM voltage which ensures that the feed-back signal coincides with the torque command signal.

As shown in FIG. 4, the voltage control device 112 includes a communication section 158. Since the four component supplying units 30 may concurrently operate, the voltage of the primary coil 116 is detected and a feed-back signal indicative of the detected voltage is transmitted to the high frequency induction power generation controller 108 via the no-connection information transmitting device 88. The communication section 158 modulates a high frequency carrier wave based on the feed-back signal, and the thus modulated carrier wave is demodulated by the two-way serial high-speed communication device 86.

In the present embodiment, after the EC supplying apparatus 12 is built up, each of the four movable tables 34 is moved to a reference position, and an output value of the absolute encoder 48 at that time is stored in a non-volatile memory (ROM, back-up memory, RAM, external memory device, etc.) of the main controller 80. This output value is indicative of an error or difference between the reference position of each table 34 and a reference value (e.g., 0) of the encoder 48. It is generally difficult to assemble a servomotor with a position detector which detects a rotation position of the motor, such that a reference position of the motor accurately coincides with that of the position detector. Therefore, it cannot be said that the respective output values of the four absolute encoders 48 accurately represent the respective current positions of the four tables 34. The above-indicated output values of the four encoders 48 stored in the non-volatile memory of the main controller 80 are utilized for calculating respective target rotation positions of the four servomotors 46, respectively. Thus, the EC supplying cartridge 32 on each component supplying unit 30 is accurately moved to, and positioned at, the EC supplying position.

Next, there will be described the operation of the EC supplying apparatus 12 constructed as described above.

One or more component supplying units 30 are used for supplying ECs needed for one PC board. In the case where two or more component supplying units 30 are used for supplying ECs, one of the supplying units 30 is selected and moved to the EC supplying area for supplying ECs, while the other supplying unit or units 30 waits or wait in the waiting areas on both sides of the EC supplying area. After the said one unit 30 is moved back to an appropriate one of the two waiting areas, the other unit 30 or one of the other units 30 is moved to the EC supplying area for supplying ECs. Each supplying unit 30 supplies ECs while being moved in the EC supplying area so as to position an appropriate one of the EC supplying cartridges 32 at the EC supplying position.

In the present EC supplying apparatus 12, the main controller 80 judges, before an EC supplying operation is started, whether an EC supplying operation can be started, based on the respective signals supplied from the four computers 38. If the computer or computers 38 of one or more of the four component suction units 40 which is or are to be used in the EC supplying operation to be started supplies or supply the normal cartridge distribution signal and the normal cartridge setting signal to the main controller 80, the main controller 80 judges that the EC supplying operation can be started, because there is no abnormality with the cartridges 32 of the unit or units 30 to be used in the EC supplying operation. Thus, the main controller 80 supplies a command signal to the servomotor control circuit 82 to start the EC supplying operation.

On the other hand, if at least one of the computer or computers 38 of one or more component suction units 40 which is or are to be used in the EC supplying operation to be started supplies the abnormal cartridge distribution signal and/or the abnormal cartridge setting signal to the main controller 80, the main controller 80 judges that the EC supplying operation cannot be started, and does not supply the command signal to the servomotor control circuit 82. Thus, the EC supplying operation is inhibited. In the latter case, the main controller 80 operates an alarm device (not shown) to issue an alarm sound so as to inform an operator of the occurrence of an abnormality, and operates a display device (not shown) to display information indicating that an abnormal cartridge distribution has been identified, information indicating one or more particular cartridge setting areas in which one or more cartridges are erroneously set and/or one or more particular cartridge setting areas in which no cartridges are erroneously set, information indicating that at least one abnormal cartridge setting has been identified, information indicating one or more particular cartridge setting areas in which one or more abnormal cartridge settings have occurred, and information indicating the front and/or rear cartridge sensors 36, 37 associated with the particular cartridge setting area or areas. According to the information displayed on the display device, the operator can quickly remove the abnormality or abnormalities by resetting the particular cartridges 32 in the correct cartridge setting areas and/or adjusting the respective setting states of the particular cartridges 32 such that no excessive spaces are left under the cartridges 32 set in the cartridge setting areas. Thus, the main controller 80 receives the normal cartridge distribution signal and the normal cartridge setting signal from all the computer or computers 38 of one or more supplying units 30 which is or are used in the EC supplying operation to be started.

Hence, the main controller 80 supplies a command signal to the servomotor control circuit 82 to start the EC supplying operation.

In the case where an abnormal cartridge distribution occurs because a cartridge 32 is set in a cartridge setting area in which no cartridge 32 should be set and simultaneously an abnormal cartridge setting occurs because that cartridge 32 is inappropriately set in that cartridge setting area, both the abnormal cartridge distribution and the abnormal cartridge setting can be removed by removing that cartridge 32 from that cartridge setting area. In the case where an abnormal cartridge distribution occurs because no cartridge 32 is set in a cartridge setting area in which a cartridge 32 should be set, the abnormal cartridge distribution can be removed by setting a cartridge 32 in that cartridge setting area. In the latter case, however, if the cartridge 32 is inappropriately set in that cartridge setting area, the abnormal cartridge setting signal is issued. If the abnormal cartridge setting is eliminated, the normal cartridge setting signal is issued. In the case where an abnormal cartridge setting occurs because one of the two cartridge-absence flags associated with a cartridge setting area is set to "1" and the other flag is reset to "0", the abnormal cartridge setting can be removed by appropriately resetting the front or rear portion of the cartridge 32 in the cartridge setting area. If this is not possible, the cartridge 32 may be completely removed from the setting area and another cartridge 32.

An EC mounting control program which specifies one or more of the four component supplying units 30, the number of ECs supplied by one or more of the EC supplying cartridges 32 of the specified unit or units 30, EC mounting places where ECs are mounted on a PC board, etc. is selected depending upon the kind of the PC board used. Various EC mounting control programs are pre-stored in the non-volatile memory of the main controller 80. According to the selected EC mounting control program, one or more component supplying units 30 are moved to the EC supplying area for supplying ECs to the PC board.

The detection signals output by the four absolute encoders 48 are supplied to the main controller 80. Based on the respective current positions of the four component supplying units 30 and data indicative of the unit 30 and the cartridge 32 to be used first for supplying ECs, the main controller 80 determines a table speed control pattern which defines an acceleration value of the table moving servomotor 46 when the motor 46 is started, a speed of the motor 46 while the motor 46 is rotated in a steady state, and a deceleration value of the motor 46 when the motor 46 is braked. In addition, the main controller 80 determines instantaneous torque command values and supplies those command values to the servomotor control device 70. Thus, the table moving servomotor 46 is started, and the component supplying unit 30 to be used first is moved from one of the waiting area to the EC supplying area so that the EC supplying cartridge 32 to be used first is positioned at the EC supplying position. The control section 74 of the servomotor control device 70 includes the acceleration sensor 156 as described above. The current-supply command generator 154 generates a current-supply command signal based on the current position of the motor 46, the current acceleration of the table 34, and the current torque command signal. Thus, the speed of movement of the table 34 is accurately changed according to the predetermined table speed control pattern, and the component supplying unit 30 is moved with reduced vibration.

In many cases, a component supplying unit 30 includes a plurality of EC supplying cartridges 32. In those cases, after one of the cartridges 32 has supplied ECs, the table 34 of the unit 30 is moved so that the other or another cartridge 32 is moved to the EC supplying position. Before this movement of the table 34, the main controller 80 determines a table speed control pattern. In the latter case, however, the distance of movement of the table 34 is short, and accordingly the determined speed control pattern consists of an acceleration control and a deceleration control only. This movement is controlled based on the detected acceleration value.

After a component supplying unit 30 has ended supplying ECs, the unit 30 is moved from the EC supplying area to an appropriate one of the two waiting areas. In this case, too, the main controller 80 determines a table speed control pattern, and determines a current-supply command signal based on the detected acceleration value. Thus, the table 34 is moved with reduced vibration. In the case where another or second unit 30 is used to supply ECs, the preceding or first unit 30 is moved to one of the two waiting areas which does not interfere with the movement of the second unit 30. At the end of the EC supplying of the first unit 30, the second unit 30 is moved from the other waiting area to the EC supplying area and waits for supplying ECs. When the first unit 30 is moved from the EC supplying area to the said one waiting area, concurrently the second unit 30 waiting is moved so that the EC supplying cartridge 32 to be used first for supplying ECs is moved to the EC supplying position.

When one of the four component supplying units 30 is moved or when two or more units 30 are concurrently moved, an abnormality may occur to the table moving servomotor or motors 46, the absolute encoder or encoders 48, etc. In this case, the two or more units 30 moving, the unit 30 moving and the unit 30 stopped, or the unit 30 moving and the support member 62 may come near to each other beyond a permissible small distance. However, this is detected by an appropriate one of the five small-distance sensors 64. The respective detection signals output from the four sensors 64 mounted on the four tables 34 are transmitted from the computers 38 to the main controller 80 via the communication sections 72 and the no-connection information transmitting device 88. The detection signal of the sensor 64 provided on one of the support members 62 is directly sent to the main controller 80. The main controller 80 outputs, based on the signals supplied from the sensors 64, a motor stop command to the servomotor control circuit 82, so that one or more units 30 moving is stopped to avoid collision. This abnormality may be detected by the sensor 64 mounted on the table 34 moving, or the table 34 stopped or the support member 62. Since, however, the main controller 80 has the information about which unit or units 30 is or are now moving, the main controller 80 can identify which unit or units 30 should be stopped to avoid collision, whichever sensor 64 supplies an abnormal detection signal to the controller 80.

In the case where two or more EC supplying units 30 are moved to the EC supplying area one after another for supplying ECs, a small-distance sensor 64 may detect an abnormally small distance between the first or preceding unit 30 and the second or following unit 30, when the second unit 30 is moved to the EC supplying area though the first unit 30 remains in the EC supplying area. In this case, too, the second unit 30 is stopped based on the detection signal supplied from the sensor 64. After the first unit 30 is moved away, the second unit 30 is moved from that position so that the cartridge 32 to be used first is positioned at the EC supplying position for supplying ECs to the EC mounting apparatus 10.

As is apparent from the foregoing description, in the present embodiment, the four servomotor control devices 70 provide movable-member-side control devices; and the main controller 80 and the servomotor control circuit 82 cooperate with each other to provide a frame-member-side control device. A portion of the main controller 80 which inhibits, based on the signals supplied from the abnormal cartridge distribution sensors 40 and the abnormal cartridge setting sensors 42, the component supplying units 30 from supplying the ECs provides an inhibiting device; the inhibiting device cooperates with the sensors 40, 42 to provide a cartridge-setting-state detecting device.

Figure 7:
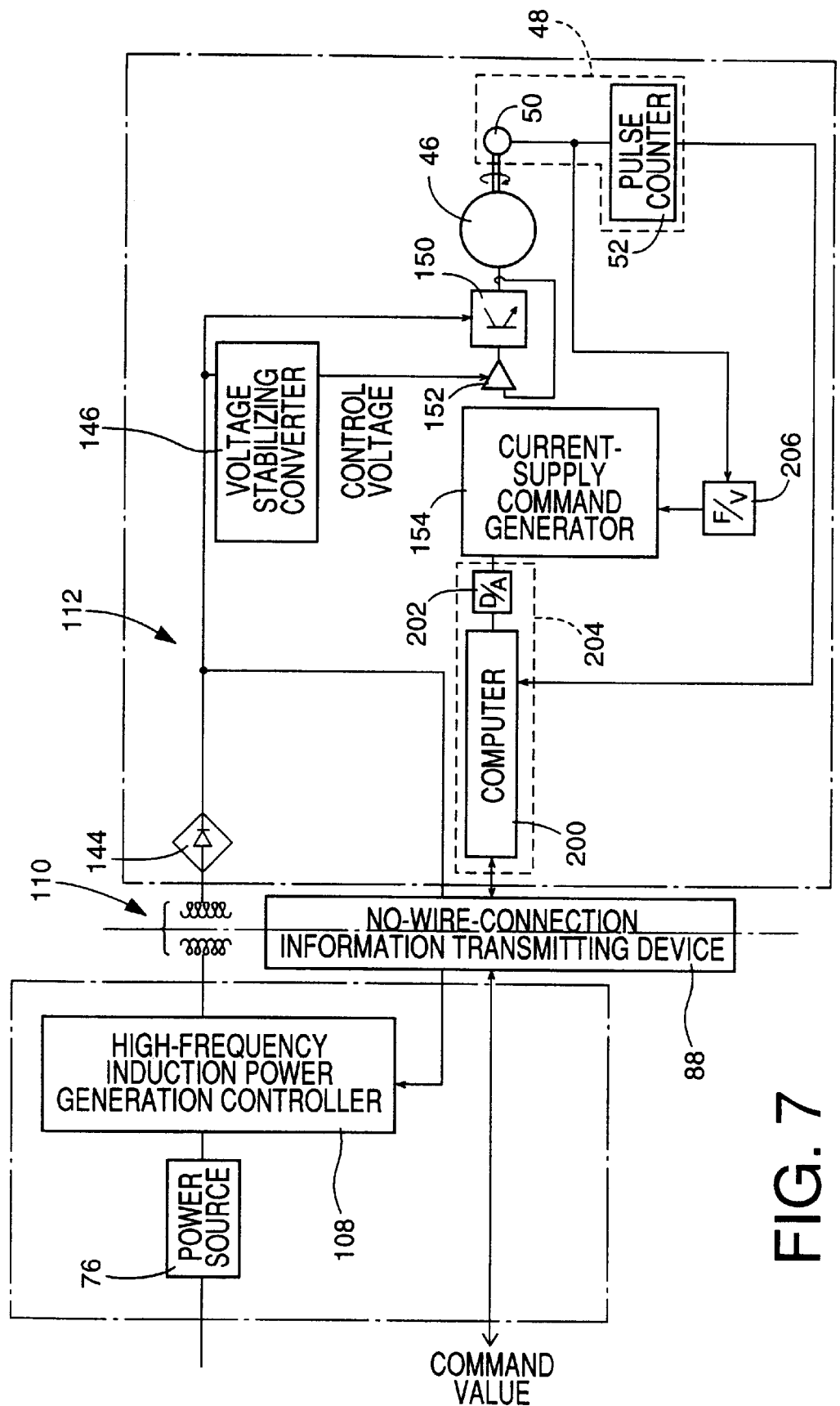
FIG. 7 is a view corresponding to FIG. 5, showing a control circuit which controls a servomotor employed in another EC supplying apparatus as a second embodiment of the present invention.

Referring next to FIG. 7, there will be described another control circuit employed in a second embodiment of the present invention, for controlling each one of four table moving servomotors 46 which are provided on four movable tables 34, respectively. The same reference numerals as used for the first embodiment shown in FIGS. 1–6 are used to designate the corresponding elements or parts of the second embodiment, and the description thereof is omitted from the following description that relates only to the differences between the first and second embodiments.

In the second embodiment, a main controller 80 provided on the side of a frame member including a base 58 supplies, to each one of four component supplying units 30 via a no-connection information transmitting device 88, (a) a target-position signal indicative of a target rotation position of a corresponding one of the four servomotors 46 and (b) a rotation-speed signal indicative of a steady-state rotation speed of the same motor 46. The main controller 80 receives, from the side of the component supplying units 30, via the no-connection information transmitting device 88, (c) operation-end information indicating that the motor 46 has been rotated to the target rotation position (strictly, to within a tolerable-error range around the target position) and (d) abnormality-detection information indicating that an abnormal operation of the motor 46 has been detected.

In the second embodiment, an intelligent control section 204 including a computer 200 and a digital to analog (D/C) converter 202 is provided on each one of the respective tables 34 of the units 30. The computer 200 determines, based on the target-position command value and rotation-speed command value supplied via the information transmitting device 88, a table speed control pattern including the acceleration of rotation of the table moving servomotor 46 when the motor 46 is started, the speed of rotation of the motor 46 in a steady state, and the deceleration of rotation of the motor 46 when the motor 46 is braked. The computer 200 is supplied with a digital value from an absolute encoder 48 and determines instantaneous torque command values based on the thus determined table speed control pattern and the digital values indicative of the rotation positions of the motor 46.

A torque command value output from the computer 200 is converted by the D/A converter 202 into a torque command signal in the form of an analog signal, which is supplied to a current-supply command generator 154. The command generator 154 is connected to an F/V (frequency to voltage) converter 206 which converts the frequency of pulse signals supplied from an incremental encoder 50 of the absolute encoder 48, into a voltage whose magnitude is proportional to the rotation speed of the motor 46. The current-supply command generator 154 generates a current-supply command signal based on the torque command signal from the D/A converter 202 and the voltage from the F/F converter 206. The control operations following the above-described operations are the same as those described previously for the first embodiment, and accordingly the description thereof is omitted.

In the first embodiment shown in FIGS. 1–6, the main controller 80 provided on the side of the frame member including the base 58 has the function of determining a table speed control pattern for each of the servomotors 46, and determines, according to the determined control pattern, instantaneous command signals corresponding to target rotation positions that change as time elapses. The thus determined command signals are supplied to the position amplifier 100. In contrast, in the present embodiment, the computer 200 of the intelligent section 204 of each component supplying unit 30 has the function of determining a table speed control pattern for a corresponding one of the motors 46. Accordingly, the information supplied from the side of the frame member including the base 58 to each component supplying unit 30 via the no-connection information transmitting device 88, contains only the information indicative of the final target rotation position of the motor 46 and the information indicative of the steady-state rotation speed of the same 46. The information supplied from the side of each unit 30 to the side of the frame member, contains only the operation-end information and abnormality-detection information described previously. In the second embodiment, therefore, the frequency of information transmission is reduced, and the main controller 80 can use an increased time for carrying out other operations than the information transmission.

The computer 200 of each unit 30 identifies, based on detection signals supplied from pairs of front and rear cartridge sensors 36, 37, a cartridge distribution state in which EC supplying cartridges 32 are distributed on the table 34, and judges whether each cartridge 32 is appropriately set in a corresponding cartridge setting area on the table 34. The computer 200 supplies a normal or abnormal cartridge distribution signal and a normal or abnormal cartridge setting signal to the main controller 80. If all the units 30 to be used in an EC supplying operation supplies normal signals to the main controller 80, the controller 80 permits those units 30 to supply ECs to the EC mounting apparatus 10. However, if at least one of the units 30 to be used, the controller 80 inhibits those units 30 from supplying ECs. Alternatively, the computer 200 may be modified such that, when an abnormality is detected, the computer 200 supplies an abnormality-detection signal to the main controller 80 and inhibits the motors 46 of those units 30 from being rotated.

The computer 200 receives a detection signal from a small-distance sensor 64. If the sensor 64 supplies an abnormality-detection signal to the computer 200 while the table 34 is moved, the computer 200 stops the rotation of the motor 46, thereby stopping the movement of the table 34. In the case where the sensor 64 of the unit 30 being stopped detects an abnormally small distance from the unit 30 moving, the computer 200 of the unit 30 stopped transmits an abnormality-detection signal to the main controller 80 via the no-connection information transmitting device 88, so that the controller 80 supplies a stop command to the unit 30 moving toward the unit 30 stopped, thereby avoiding a collision of the two units 30.

In the second embodiment, the communication between a communication control section 84 and each of respective communication sections 72 of the four component supplying units 30 is performed as follows:

The main controller 80 periodically performs an information transmitting operation at a regular interval of time. Each information transmitting operation is finished in a time duration (hereinafter, referred to as the "allowed communication time") which is sufficiently shorter than the above-indicated regular interval. Thus, the information transmitting communication between the communication control section 84 and each communication section 72 is finished within the allowed communication time.

In the case where the main controller 80 has information to be transmitted, first, the controller 80 transmits the information via the communication control section 84 and, then, each of the communication sections 72 supplies the operation-end and/or abnormality-detection information to the main controller 80. Thus, strictly, in the present embodiment, the EC supplying apparatus employs a "semi"-two-way communication method.

First, based on an address code added to the head of information supplied from the main controller 80 to the communication control section 84, the control section 84 sends an addressee signal indicative of a particular one of the four communication sections 72 to which the information is to be transmitted. Thus, the particular one section 72 is made ready for receiving the information, and sends back a ready signal to the communication control section 84. In response thereto, the control section 84 supplies information indicative of a target rotation position of the servomotor 46 and information indicative of a steady-state rotation speed of the same 46 needed to reach the target rotation position, and additionally supplies information used for error checking. More specifically described, the main controller 80 supplies, to the communication control section 84, the data indicative of the target rotation position and the data indicative of the steady-state rotation speed, and additional data relating to the error checking (e.g., cyclic code obtained by treating, using a specific binary polynomial, data in a data block). Thus, a redundancy check (e.g., cyclic redundancy check, CRC) is performed.

Accordingly, each communication section 72 performs the redundancy check after receiving the motor control information from the communication control section 84, and sends back, to the control section 84, information indicating that the communication section 72 has received the information appropriately or inappropriately.

One or more of the four communication sections 72 which corresponds or correspond to one or more servomotors 46 which has or have finished an operation, or suffered an operational abnormality, after the preceding allowed communication period has elapsed, transmits or transmit a call signal to call the communication control section 84, after the communication caused by the control section 84 has ended. In response thereto, the control section 84 sends back a ready signal to that or those communication sections 72, which or each of which then transmits operation-end and/or abnormality-detection information with a sender signal indicative of itself as the sender.

Coded signals such as ASCII (American National Standard Code for Information Interchange) coded signals are used for all the communications between the communication control section 84 and each of the communication sections 72 via the no-connection information transmitting device 88. Parallel coded signals are converted into serial coded signals by a parallel to serial converter (not shown), and the serial coded signals are amplitude-modulated or frequency-modulated and then are transmitted in a wireless manner by the no-connection information transmitting device 88. Subsequently, the received serial coded signals are demodulated and then converted into the parallel coded signals again.

In the second embodiment, the communication control section 84 supplies information indicative of the final target rotation position and steady-state rotation speed of each servomotor 46. Based on that information, the intelligent control section 204 of each EC mounting unit 30 determines a table speed control pattern and controls each servomotor 46 according to the determined control pattern. However, it is possible to modify the present embodiment such that a table speed control pattern is determined on the side of the frame member including the base 58 and the control section 84 supplies command values indicative of instantaneous target rotation positions of each servomotor 46, according to the determined control pattern. The instantaneous target rotation positions correspond to vary short intervals of time, respectively. In the latter case, it is preferred that the intelligent control section 204 provided on each table 34 be replaced by a smoothing device which produces a signal indicative of a smoothed target rotation position obtained by smoothing a predetermined number of instantaneous target rotation positions that gradually change at very short intervals. Otherwise, the intelligent control section 204 may be omitted without employing anything in place of the same 204. In the latter case, the output values of the absolute encoders 48 are supplied from the side of the tables 34 to the side of the frame member including the base 58 via the no-connection information transmitting device 88.

In the second embodiment, when each of the four communication sections 72 has information to be transmitted to the communication control section 84, that communication section 72 calls the control section 84. However, it is possible to modify the second embodiment such that each time the control section 84 supplies information to each communication section 72, that communication section 72 supplies, to the control section 84, information which may include (a) information indicating that the corresponding servomotor 46 has been rotated to a prior commanded target rotation position and/or (b) information indicating that an abnormality has occurred during the rotation toward the target rotation position, after the transmission of information from the control section 84 to that communication section 72 has ended. In the latter case, each communication section 72 need have the function of calling the control section 84, thereby contributing to simplifying the present communication system. This communication manner is not suitable for the second embodiment wherein the a communication control section 84 supplies a final target rotation position and a steady-state rotation speed for each of the servomotors 46, to a corresponding one of the communication sections 72, and is suitable for the first embodiment wherein the communication control section 84 supplies instantaneous target rotation positions of each servomotor 46. In the former case, since the frequency of information supplying from the control section 84 is low, it may take a long time for each communication section 72 to supply information to the control section 84 and accordingly the main controller 80 may receive delayed information indicative of an operating state of each servomotor 46. In contrast, in the latter case, the frequency of information supplying from the control section 84 is very high and accordingly the main controller 80 can receive, without delay, information indicative of an operating state of each servomotor 46.

Referring next to FIGS. 8A to 8D, there will be described a linear motor 210 which is employed in place of each of the four table moving servomotors 46 in another EC supplying apparatus as a third embodiment of the present invention. The same reference numerals as used in the first embodiment shown in FIGS. 1 to 6 are used to designate the corresponding elements or part of the third embodiment.

The linear motor 210 is a PM (permanent magnet) type linear motor. FIGS. 8A to 8D show the manner in which the linear motor 210 operates. The linear motor 210 includes a stationary member in the form of a stator core 212 which is fixed to a frame member (including a base 58) of the present EC supplying apparatus as the third embodiment. The linear motor 210 further includes a mover 214 in the form of a toothed member which is fixed to a movable table 34 of each of four component supplying units 30. The mover 214 has a yoke 216 to which a permanent magnetic 218 is fixed. A first core 220 and a second core 222 are fixed to the permanent magnet 218. The magnetic flux from the S pole to the N pole of the permanent magnet 218 is indicated at arrow in the figures. The first core 220 has two teeth 224, 226, and the second core 222 has two teeth 228, 230. A first coil 232 is wound around the two teeth 224, 226 such that the two teeth 224, 226 have opposite polarities, respectively, and a second coil 236 is wound around the teeth 228, 230 such that the two teeth 228, 230 have opposite polarities, respectively.

The stator core 212 has an elongate shape and has a number of teeth 240 which are opposed to the teeth 224–230 of the mover 214.

Figure 8A:
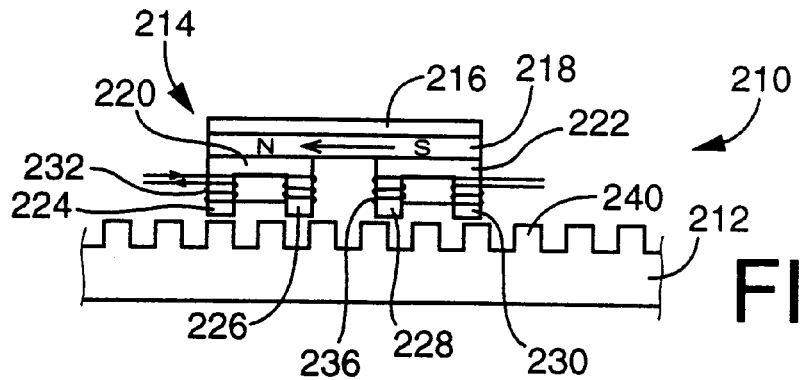
FIG. 8A is a view illustrating a first step for the movement of a mover of a linear motor employed in yet another EC supplying apparatus as a third embodiment of the present invention.
Figure 8B:
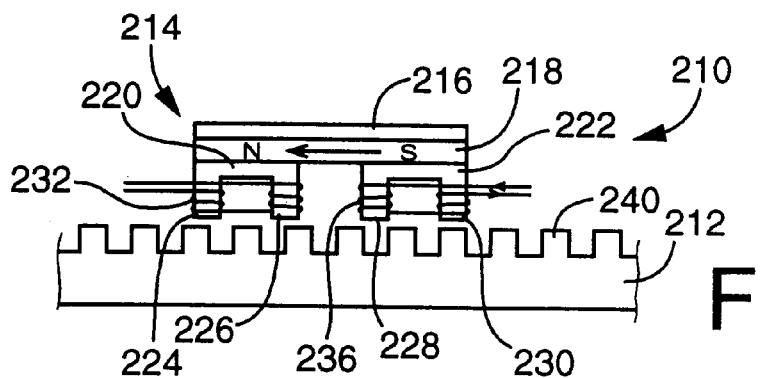
FIG. 8B is a view illustrating a second step for the movement of the mover of the linear motor of FIG. 8A.
Figure 8C:
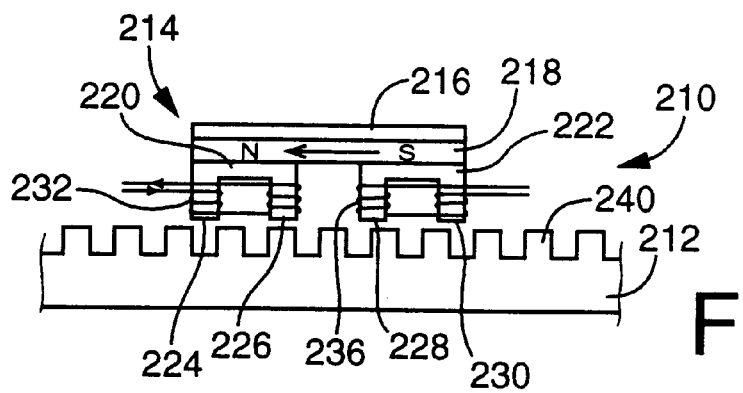
FIG. 8C is a view illustrating a third step for the movement of the mover of the linear motor of FIG. 8A.
Figure 8D:
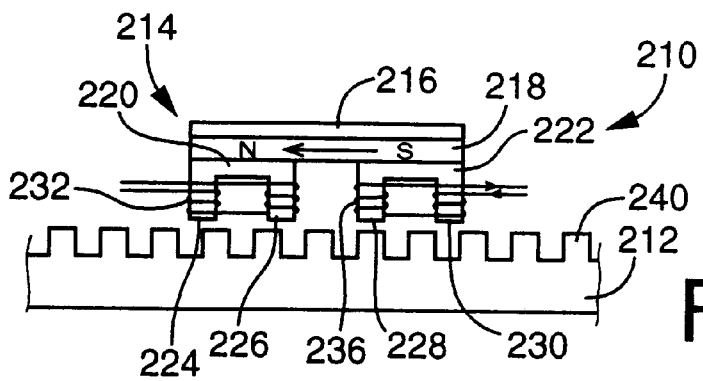
FIG. 8D is a view illustrating a fourth step for the movement of the mover of the linear motor of FIG. 8A.

When an electric current is applied to the first coil 232 in one direction indicated in FIG. 8A, the mover 214 is stopped at a position shown in Fig. FIG. 8A, because the electric current strengthens the magnetic flux of the permanent magnet 218 in the tooth 224. When an electric current is applied to the second coil 236 in one direction indicated in FIG. 8B, the mover 214 is stopped at a position shown in Fig. FIG. 8B, because the electric current strengthens the magnetic flux of the permanent magnet 218 in the tooth 230. When the electric current is applied to the first coil 232 in the opposite direction indicated in FIG. 8C, the mover 214 is stopped at a position shown in Fig. FIG. 8C, because the electric current strengthens the magnetic flux of the permanent magnet 218 in the tooth 226. When the electric current is applied to the second coil 236 in the opposite direction indicated in FIG. 8D, the mover 214 is stopped at a position shown in Fig. FIG. 8D, because the electric current strengthens the magnetic flux of the permanent magnet 218 in the tooth 228. Thus, the component supplying unit 30 or the movable table 34 to which the mover 214 is fixed can be moved to any desired position relative to the stator core 212 by controlling the supplying or cutting of electric currents to or from the two coils 232, 236 of the mover 214 and changing the directions of each of the electric currents. The teeth 240 of the stator core 212 are provided at a predetermined pitch, and the four teeth 224–230 are provided at a predetermined different pitch.

While the present invention has been described in its preferred embodiments, it is to be understood that the invention may otherwise be embodied.

For example, the combination of the nuts 44 and the ball screw 60 employed in the first embodiment may be replaced by the combination of pinions and a rack.

In each of the illustrated embodiments, each of the table-side sending and receiving coils 90 of the no-wire-connection information transmitting device 88 is covered by the shield member and is disposed at the position adjacent to the table-side secondary core 122 of the no-wire-connection electricity supplying device 110, and the frame-member-side sending and receiving coil 92 is covered by the shield member. However, it is possible that each table-side coil 90 be not covered by any shield member and be disposed at a position away from the secondary core 122 and that the frame-member-side coil 92 be not covered by any shield member. Alternatively, the coils 90, 92 may be covered by shield members, and may be disposed at positions away from the secondary cores 122.

In each of the illustrated embodiments, each of the table moving servomotors 46 is feed-back controlled by detecting the rotation position and speed thereof. However, it is not essentially required. Each motor 46 may be open-loop controlled. In the latter case, if each of the component supplying units 30 need not send back a ready signal when receiving information from the side of the frame member 58 and simultaneously if each unit 30 need not send any signals including abnormality-detection signals to the side of the frame member 58, it is possible to modify each of the communication sections 72 not to have the information transmitting function and modify the communication control section 84 not to have the information receiving function, thereby simplifying the construction of the communication system.

In the first embodiment shown in FIGS. 1 to 6, the main controller 80 determines a table speed control pattern for each of the table moving servomotors 46, and determines instantaneous target rotation positions of each motor 46. However, it is possible that the main controller 80 be adapted to have only the function of determining speed control patterns and that a speed control computer be additionally employed which determines and commands instantaneous target rotation positions of each motor 46 according to a speed control pattern determined by the main controller 80. This speed control computer may be commonly used with two or more or all of the component supplying units 30, or otherwise each unit 30 may be provided with one such speed control computer.

In each of the illustrated embodiments, the number of turns of the primary coil 116 of the non-wire-connection electricity supplying device 110 is equal to that of the secondary coil 132. However, in the case where there is a need to transform the electric voltage, it is possible to employ the combination of primary and secondary coils which have different numbers of turns.

In each of the illustrated embodiments, each of the computers 38 has the same number of cartridge-absence flags as that of the front and rear cartridge sensors 36, 37 in total, i.e., two flags for each EC supplying cartridge 32. Therefore, each computer 38 can identify, with accuracy, whether or not a cartridge 32 is set in each cartridge setting area on a corresponding table 34. For example, even in the case where a cartridge 32 is abnormally or inappropriately set in a cartridge setting area such that one of the front and rear portions of the cartridge 32 is completely offset from the optical axis of the light emitter and receiver of a corresponding one of the front and rear cartridge sensors 36, 37, the other cartridge sensor 36, 37 can detect that the cartridge 32 is set in the cartridge setting area, because the two cartridge sensors 36, 37 are associated with the cartridge setting area. In this case, if only a single cartridge sensor is provided for a cartridge setting area, the computer 38 may erroneously identify that no cartridge 32 is set in the cartridge setting area although, in fact, a cartridge 32 is set. However, it is not essentially required that two cartridge absence flags be used for each cartridge setting area. A single flag may be used with each cartridge setting area. In the latter case, the setting and resetting of each flag is performed based on the light amount received by the light receiver of one of the front and rear cartridge sensors 36, 37 corresponding to that flag. Thus, in the latter case, too, the presence or absence of a cartridge 32 can be quickly identified. Alternatively, the setting and resetting of each flag may be performed based on the respective light amounts received by a the respective light receivers of the front and rear cartridge sensors 36, 37 corresponding to that flag.

In each of the illustrated embodiments, each of the computers 38 performs the setting or recessing of each of all the normal-cartridge-setting flags whose total number is equal to that of the front and rear cartridge sensors 36, 37. However, it is possible to modify each computer 38 to perform the setting or resetting of each of only the flags which are associated with the cartridge setting areas other than the cartridge setting areas for each of which the computer 38 has judged that no cartridge 32 is set therein.

In each of the illustrated embodiments, in the case where two or more component supplying units 30 are used for employing ECs, the units 30 are moved to the EC supplying area, one by one. However, it is possible that all the units 30 to be used be gathered in the EC supplying area and those units 30 be moved in synchronism with each other, as if they were a unit, so that each of the cartridges 32 to be used may be moved to the EC supplying position.

In each of the illustrated embodiments, each of the component supplying units 30 supplies ECs to the EC mounting apparatus 10 while each unit 30 is moved in one direction. However, it is possible that each unit 30 supply ECs while being moved in opposite directions.

In each of the illustrated embodiments, if a component supplying unit 30 moving comes near to another unit 30 or each support member 62, beyond a predetermined permissible small distance, the unit 30 moving is stopped. The permissible small distance is predetermined irrespective of the speed of movement of the unit 30. However, it is possible to change the permissible small distance depending upon the speed of movement of the unit 30. In the latter case, for example, a plurality (e.g., two) of small-distance sensors having different permissible small distances are provided on each table 34. If a first unit 30 comes near to a second unit 30 beyond the longer one of the two permissible small distances, this is detected by one of the two sensors which have the longer permissible distance. Since the main controller 80 has the information indicative of the speed of movement of the first unit 30, the controller 80 stops, in response to the detection signal from the said one sensor only, the movement of the first unit 30, if the speed of movement thereof is higher than a reference value. On the other hand, if the speed of movement of the first unit 30 is not higher than the reference value, the controller 80 does not stop the movement of the first unit 30 and, when the first unit 30 comes near to the second unit 30 beyond the shorter permissible distance, the controller 80 stops the first unit 30. This is advantageous because each unit 30 can be securely stopped even if being moved at high speeds and simultaneously the shorter one of the two permissible small distances can be minimized. Thus, in the case where two or more units 30 are moved to the EC supplying area, one by one, for supplying ECs to the EC mounting apparatus 10, the distance between a unit 30 which is supplying ECs at a position in the EC supplying area and another unit 30 which is waiting at another position in the EC supplying area, can be minimized. Accordingly the time needed to change the two units 30 with each other can be minimized.

The two or more small-distance sensors having the different permissible small distances may be replaced by a single distance sensor, such as an ultrasonic sensor, for detecting the distance between adjacent two units 30. In this case, it is possible to change the permissible small distance of the distance sensor in many steps or continuously. The speed of relative movement of the adjacent two units 30 can be calculated as the rate of change of the distance between the two units 30. As the relative-movement speed increases, the permissible small distance increases. Thus, one or both of the two units 30 is or are stopped with reliability before collision.

In the first embodiment shown in FIGS. 1–6, when a first unit 30 being stopped detects that a second unit 30 comes near thereto beyond a permissible small distance, the main controller 80 may output a stop command to stop the second unit 30, if the speed of movement of the second unit 30 is greater than a reference value, since the controller 80 has the information indicative of the speed of movement of each unit 30. Meanwhile, in the second embodiment shown in FIG. 7, the respective computers 200 of all the units 30 may interchange information with each other via the main controller 80 so that each computer 200 may stop the corresponding unit 30 if the speed of movement thereof is greater than a reference value.

In each of the illustrated embodiments, if an excessively short distance between adjacent two units 30 is detected when one or both of the two units 30 is moved, the main controller 80 may stop all the movable members of the EC supplying apparatus 12 and the EC mounting apparatus 10, for example, the PC board moving device, the carrier-tape feeding device, and the index table 14.

In each of the illustrated embodiments, in the case where two or more units 30 are used for supplying ECs in an EC supplying operation, the EC supplying operation is not started if an abnormal cartridge distribution or an abnormal cartridge setting is detected from at least one of the units 30 to be used. However, in the case where the abnormality is detected from, e.g., the last unit 30 in the order of use, the EC supplying operation may be started with the normal unit or units 30. In the latter case, an inhibition command is output to inhibit the operation of the table moving servomotor 46 of the last unit 30, and the operator is informed of the detection of abnormality so that he or she may remove the abnormality while the EC supplying operation is performed with the normal unit or units 30.

In each of the illustrated embodiments, it is preferred that the light amount received by the light receiver of each cartridge sensor 36, 37 be calibrated periodically by setting a cartridge 32 in a normal posture in each cartridge setting area on each table 34. This calibration is to adjust the normal light-amount range of each sensor 36, 37 that is used as a reference range for judging whether a cartridge 32 is set in a normal posture in the cartridge setting area with which that sensor 36, 37 is associated.

In each of the illustrated embodiments, the tape feeding device which feeds the EC carrier tape on each EC supplying cartridge 32 is driven by a driving device (not shown) which drives the index table 14. However, the tape feeding device may be driven by an electrically-operated actuator such as an electric motor. In the latter case, the electric actuator operates on the electric energy supplied by the no-wire-connection electricity supplying device 110, so that the tape feeding device feeds the EC carrier tape. Thus, the tape feeding device may feed the EC carrier tape at an appropriate timing independent of the timing when each component suction head 20 of the index table 14 picks up an EC from the carrier tape.

In each of the illustrated embodiments, the radio-communication-type no-wire-connection information sending device 88 is employed. However, it is possible to employ an optical-communication-type no-wire-connection information transmitting device.

The principle of the present invention may be applicable to an EC supplying apparatus which supplies ECs to an EC mounting apparatus which is moved in a direction perpendicular to the direction of movement of component supplying units of the EC supplying apparatus in a horizontal plane and which mounts ECs on a PC board which is moved in a direction parallel to the direction of movement of the supplying units. Otherwise, the principle of the present invention may be applicable to an EC supplying apparatus which supplies ECs to an EC picking-up apparatus which picks up the ECs from EC supplying cartridges of the EC supplying apparatus for purposes other than the purpose of mounting the ECs on an object such as a PC board.

It is to be understood that the present invention may be embodied with other changes, improvements, and modifications that may occur to those skilled in the art without departing from the spirit and scope of the invention defined in the appended claims.

What is claimed is:

1. An electronic component supplying apparatus, comprising:

a frame member;

a plurality of electronic component supplying units which are supported by said frame member, each of said units comprising (a) a plurality of electronic component supplying cartridges each of which carries a plurality of electronic components and includes a component supplying portion from which said each cartridge supplies each of said components, and (b) a movable member on which said cartridges are set such that the respective component supplying portions of said cartridges are arranged along a reference line, said movable member being movable along said reference line;

a plurality of movable-member-side drive sections each of which is provided on a corresponding one of the respective movable members of said units;

a frame-member-side drive section which is provided on said frame member and which is elongate along said reference line and cooperates with said each movable-member-side drive section to move said corresponding one movable member;

a plurality of movable-member-side control devices each of which is provided on said corresponding one movable member and which controls said each movable-member-side drive section;

a power source which is provided stationarily with respect to said frame member and which provides an electric energy;

a frame-member-side control device which is provided stationarily with respect to said frame member;

an electricity supplying device which includes a first supplying section provided on said frame member and a plurality of second supplying sections each of which is provided on said corresponding one movable member, said electricity supplying device having no wire connection between said first supplying section and said each second supplying section, and supplying said electric energy from said power source to said each movable-member-side control device, while permitting said corresponding one movable member to be moved along said reference line; and an information transmitting device which includes a first transmitting section provided on said frame member and a plurality of second transmitting sections each of which is provided on said corresponding one movable member, said information transmitting device having no wire connection between said first transmitting section and said each second transmitting section, and transmitting, from said frame-side control device to said each movable-member-side control device, information needed to control said each movable-member-side drive section, while permitting said corresponding one movable member to be moved along said reference line.

2. An apparatus according to claim 1, wherein said each movable-member-side drive section comprises a rotary engaging member which is attached to said corresponding one movable member such that said engaging member is rotatable about an axis line thereof, and an electric actuator which is provided on said corresponding one movable member and which rotates said rotary engaging member under control of said each movable-member-side control device, and wherein said frame-member-side drive section comprises an elongate engaging member which is elongate along said reference line and is held in engagement with said rotary engaging member of said each movable-member-side drive section.

3. An apparatus according to claim 2, wherein said rotary engaging member comprises an internally threaded nut and said elongate engaging member comprises an externally threaded screw.

4. An apparatus according to claim 2, wherein said rotary engaging member comprises a pinion and said elongate engaging member comprises a rack.

5. An apparatus according to claim 1, further comprising an acceleration detector which detects an acceleration value of said corresponding one movable member, and an acceleration control device which controls an acceleration of said corresponding one movable member, based on the detected acceleration value, according to a reference acceleration control pattern.

6. An apparatus according to claim 1, further comprising a small-distance judging device which is provided on at least one of said units and which judges whether a distance between said at least one unit and an adjacent one of said units is shorter than a reference distance, and a collision preventing device which controls, when said judging device makes a positive judgment, the movement of at least one of said at least one unit and said adjacent one unit, so as to prevent a collision of said at least one unit and said adjacent one unit.

7. An apparatus according to claim 1, further comprising a cartridge-setting-state detecting device which detects a cartridge setting state in which at least one of said cartridges is set on said movable member of said each unit.

8. An apparatus according to claim 7, wherein said cartridge-setting-state detecting device comprises an abnormal-cartridge-setting detector which detects an abnormal cartridge setting in which said at least one cartridge is abnormally set on said movable member of said each unit and provides an abnormality detection signal indicating that said abnormal-cartridge-setting detector has detected said abnormal cartridge setting, and wherein the apparatus further comprises an inhibiting device which inhibits, when said abnormal-cartridge-setting detector provides said abnormality detection signal, said each unit from supplying said each component.

9. An apparatus according to claim 7, wherein said cartridge-setting-state detecting device comprises a cartridge-distribution detector which detects a cartridge distribution in which said cartridges are distributed on said movable member of said each unit, and wherein the apparatus further comprises an inhibiting device which inhibits, when the detected cartridge distribution is not identical with a reference cartridge distribution, said each unit from supplying said each component.

10. An apparatus according to claim 1, wherein said each cartridge comprises a tape feeding device which feeds a tape having a plurality of pockets in which said electronic components are accommodated, respectively, said tape feeding device intermittently feeding said tape at a feeding pitch which is equal to a distance between each pair of adjacent two pockets of the tape.

11. An apparatus according to claim 1, wherein said information transmitting device comprises-means for transmitting, from said frame-side control device to said each movable-member-side control device, said information including control information and addressee information indicative of a particular one of said movable-member-side control devices to which said control information is to be transmitted to control the movable-member-side drive section corresponding to said particular one movable-member-side control device.

12. An apparatus according to claim 1, wherein said first transmitting section comprises a first sending and receiving unit, and wherein said each second transmitting section comprises a second sending and receiving unit which sends, to said first sending and receiving unit, information including (a) operating-state information relating to an operating state of a corresponding one of said units and (b) sender information indicative of said corresponding one unit from which said operating-state information is to be sent to the first sending and receiving unit.

13. An apparatus according to claim 1, wherein said each movable-member-side drive section comprises a first toothed member which is fixed to said corresponding one movable member and which includes a plurality of teeth and an energizing coil which energizes said first toothed member, and wherein said frame-member-side drive section comprises a second toothed member which is fixed to said frame member and which includes a plurality of teeth which are opposed to said teeth of said first toothed member, said first and second toothed members cooperating with each other to provide a linear motor.

\* \* \* \* \*